(12) United States Patent
Cao et al.

(10) Patent No.: US 11,758,763 B2
(45) Date of Patent: Sep. 12, 2023

(54) DISPLAY PANEL, METHOD FOR MANUFACTURING THE SAME, AND DISPLAY DEVICE

(71) Applicant: Hubei Yangtze Industrial Innovation Center of Advanced Display Co., Ltd., Wuhan (CN)

(72) Inventors: Leilei Cao, Wuhan (CN); Ai Xiao, Wuhan (CN); Jiaxian Liu, Wuhan (CN); Ming Yang, Shanghai (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 206 days.

(21) Appl. No.: 17/224,349

(22) Filed: Apr. 7, 2021

(65) Prior Publication Data
US 2021/0226175 A1    Jul. 22, 2021

(30) Foreign Application Priority Data
Dec. 29, 2020 (CN) .......................... 202011596756.9

(51) Int. Cl.
*G06F 3/041* (2006.01)
*G06F 3/044* (2006.01)
(Continued)

(52) U.S. Cl.
CPC ......... *H10K 50/865* (2023.02); *G06F 3/0412* (2013.01); *G06F 3/0443* (2019.05);
(Continued)

(58) Field of Classification Search
CPC ..... H01L 51/5284; H01L 52/56; H01L 27/22; H01L 27/323; H01L 27/322; H01L 27/3246; G06F 3/0433; G06F 3/0445; G06F 3/0412; G02F 1/03338; G02F 1/133614; G02F 1/133512; G02F 1/133514; G02F 1/133516; F21V 9/32
See application file for complete search history.

(56) References Cited

U.S. PATENT DOCUMENTS

2018/0182819 A1* 6/2018 Jo .......................... G06F 3/0445
2022/0069261 A1* 3/2022 Tang .................... H01L 51/5284

FOREIGN PATENT DOCUMENTS

CN    108242456 A    7/2018

* cited by examiner

*Primary Examiner* — Angela K Davison
(74) *Attorney, Agent, or Firm* — TAROLLI, SUNDHEIM, COVELL & TUMMINO L.L.P.

(57) ABSTRACT

A display panel is provided, including an array substrate; a light-emitting layer located at a side of the array substrate and including a plurality of light-emitting units; a touch dielectric layer located at a side of the light-emitting layer facing away from the array substrate and including a plurality of first apertures; a black matrix located within each of the plurality of first apertures; and a color filter layer located at a side of the touch dielectric layer facing away from the array substrate and including a plurality of color filter units. An orthographic projection of each of the plurality of first apertures on the light-emitting layer is located between two adjacent light-emitting units of the plurality of light-emitting units. The plurality of color filter units is in one-to-one correspondence to the plurality of light-emitting units.

20 Claims, 19 Drawing Sheets

(51) Int. Cl.
  *H10K 50/86* (2023.01)
  *H10K 59/38* (2023.01)
  *H10K 59/40* (2023.01)
  *H10K 71/00* (2023.01)
  *H10K 59/122* (2023.01)
  *H10K 59/12* (2023.01)

(52) U.S. Cl.
  CPC ............. *H10K 59/38* (2023.02); *H10K 59/40* (2023.02); *H10K 71/00* (2023.02); *H10K 59/1201* (2023.02); *H10K 59/122* (2023.02)

DISPLAY PANEL, METHOD FOR MANUFACTURING THE SAME, AND DISPLAY DEVICE

CROSS-REFERENCE TO RELATED APPLICATIONS

The present application claims priority to Chinese Patent Application No. 202011596756.9, filed on Dec. 29, 2020, the content of which is incorporated herein by reference in its entirety.

TECHNICAL FIELD

The present disclosure relates to the field of display technologies, and particularly, to a display panel, a method for manufacturing the display panel, and a display device.

BACKGROUND

As a new generation of display device, an OLED (Organic Light-Emitting Diode) display device has advantages of thin and light, high contrast, fast response, wide view angle, high luminance, and full color, which has a very broad application prospect in mobile phones, personal digital Assistants (PDAs), digital cameras, on-board monitors, laptop computers, wall-mounted TVs, and military fields.

In order to reduce reflectivity of external light in the OLED display device, a solution is proposed that a circular polarizer may be attached to a light-exiting surface of the OLED display device. However, about a half of the light emitted from the OLED display device will be absorbed by the circular polarizer, so that light emission effect of the OLED display device is reduced.

Another solution is proposed that a color filter is arranged on the light-exiting surface of the OLED display device. Such an arrangement has better effect of reducing reflection of ambient light in the OLED display device and improving light-emission of the OLED display device.

In the related art, a color filter is integrated into a display panel, which not only improves anti-reflection capacity of the display panel but also reduces thickness of the entire display panel. However, preparing the color filter on the display panel in related art is required to firstly produce a BM (Black Matrix) and then produce the color filter layer by coating a color filter material. In this process, presence of the BM makes horn defects of the color filter material at the position where the color filter overlaps the BM, thereby suffering problems such as non-uniformity display at the position of the horn defects.

SUMMARY

In view of the above, the present disclosure provides a display panel, a method for manufacturing the display panel, and a display device, which can effectively improve display uniformity of the display panel.

In a first aspect of the present disclosure, a display panel is provided. The display panel includes an array substrate; a light-emitting layer located at a side of the array substrate and including a plurality of light-emitting units; a touch dielectric layer located at a side of the light-emitting layer facing away from the array substrate and including a plurality of first apertures; a black matrix located within each of the plurality of first apertures; and a color filter layer located at a side of the touch dielectric layer facing away from the array substrate and including a plurality of color filter units. An orthographic projection of each of the plurality of first apertures on the light-emitting layer is located between two adjacent light-emitting units of the plurality of light-emitting units. The plurality of color filter units is in one-to-one correspondence to the plurality of light-emitting units.

In a second aspect of the present disclosure, a display device is also provided. The display device includes the display panel described as above.

In a third aspect of the present disclosure, based on a same inventive concept, a method for manufacturing a display panel is provided. The method includes providing an array substrate; forming a light-emitting layer at a side of the array substrate and includes a plurality of light-emitting units; and forming a touch dielectric layer and a black matrix. The touch dielectric layer is located at a side of the light-emitting layer facing away from the array substrate and includes a plurality of first apertures. An orthographic projection of each of the plurality of first apertures on the light-emitting layer is located between two adjacent light-emitting units of the plurality of light-emitting units. The black matrix is located within the first aperture.

BRIEF DESCRIPTION OF DRAWINGS

In order to more clearly illustrate technical solutions of embodiments of the present disclosure, the accompanying drawings used in the embodiments are briefly described below. The drawings described below are merely a portion of the embodiments of the present disclosure. Based on these drawings, those skilled in the art may obtain other drawings without any creative effort.

DESCRIPTION OF EMBODIMENTS

Figure 1:
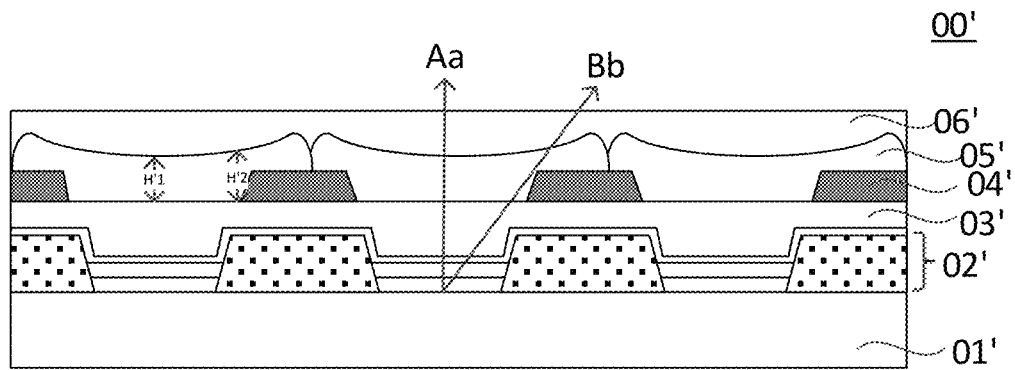
FIG. 1 is a schematic diagram showing a display panel in the related art.

In order to better understand the above objects, features and advantages of the present disclosure, the present disclosure is described in detail with reference to the accompanying drawings and embodiments.

It should be noted that specific details are set forth in the following description in order to fully understand the present disclosure. However, the present disclosure may be implemented in many other ways different from those described herein, those skilled in the art may make similar extensions without departing from the spirit of the present disclosure. Therefore, the present disclosure is not limited by the specific embodiments disclosed below. In addition, in the following description, the same reference signs in the drawings denote a same or similar structure, and thus their repeated description will be omitted.

FIG. 1 is a schematic diagram showing a display panel in the related art. As shown in FIG. 1, the display panel 00' includes an array substrate 01', a light-emitting layer 02', an encapsulation layer 03' and a color filter. The color filter includes a black matrix 04', a color filter unit 05', and a color film flat layer 06' located at a side of the color filter unit 05' away from the array substrate 01'.

In the related art, the color filter is integrated into the display panel, so that anti-reflection capacity of the display panel is improved and meanwhile a thickness of the entire display panel is reduced. However, as shown in FIG. 1, manufacturing the color filter on the display panel in the related art includes: first forming a black matrix (BM), and then forming a color filter layer by coating a color filter material. In this process, presence of the black matrix results in the color filter material being stack at an overlapping position with the black matrix to cause a horn defect, so that a thickness H'2 of the color filter unit close to the position of the black matrix 04' is greater than a thickness H'1 of the color filter unit in a central region of the color filter unit 05'. On one hand, the horn may cause display non-uniformity of the display panel. On the other hand, because H'2>H'1, the horn may increase the difference in the passing through thickness of the CF between a light Aa having a front view angle and a light Ba having a large view angle, so that attenuation difference is further increased, thereby resulting in color deviation of view angle.

On this basis, the present disclosure proposes a display panel. On one hand, the display uniformity of the display panel is improved, and view angle color deviation is reduced. On the other hand, combined with the display panel structure, the light-emitting with a large view angle of light is improved while achieving color deviation of view angle, thereby improving the light-emitting efficiency of the display panel.

Figure 2:
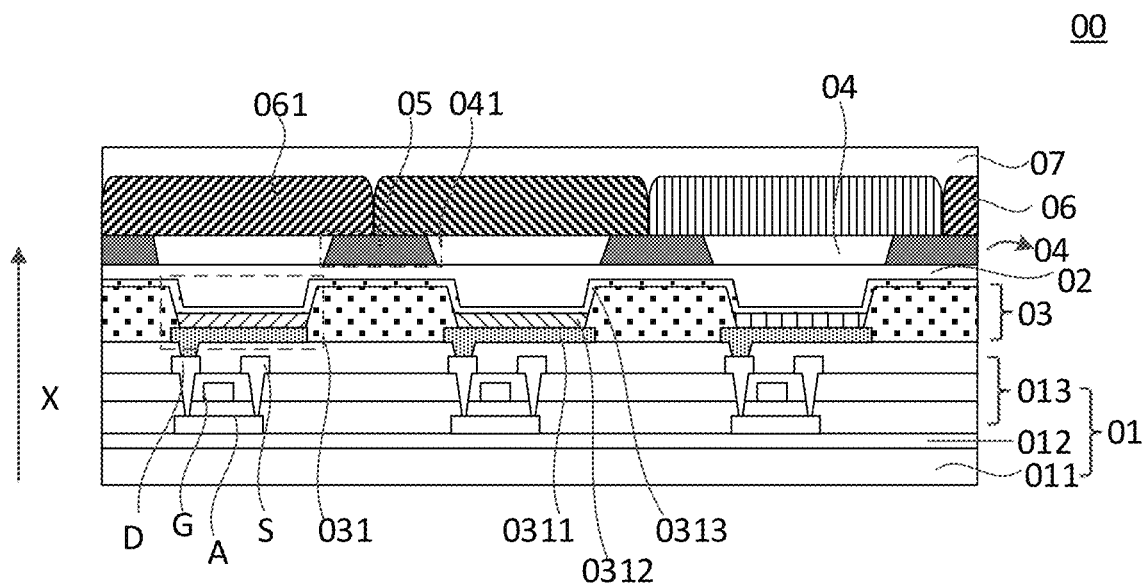
FIG. 2 is a schematic diagram showing a display panel according to an embodiment of the present disclosure.
Figure 3:
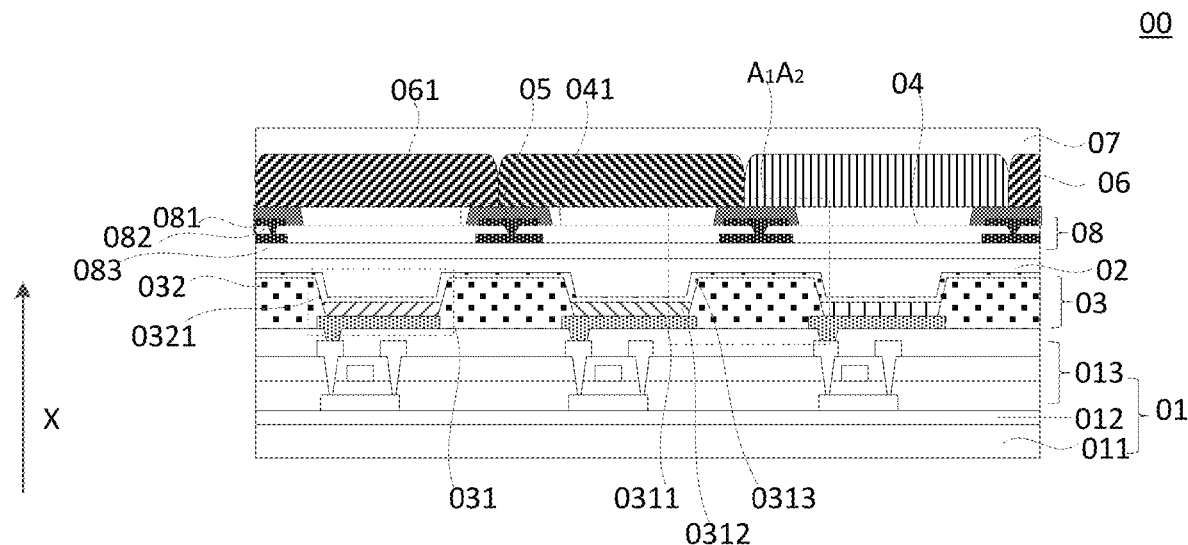
FIG. 3 is a schematic diagram showing a display panel according to another embodiment of the present disclosure.
Figure 4:
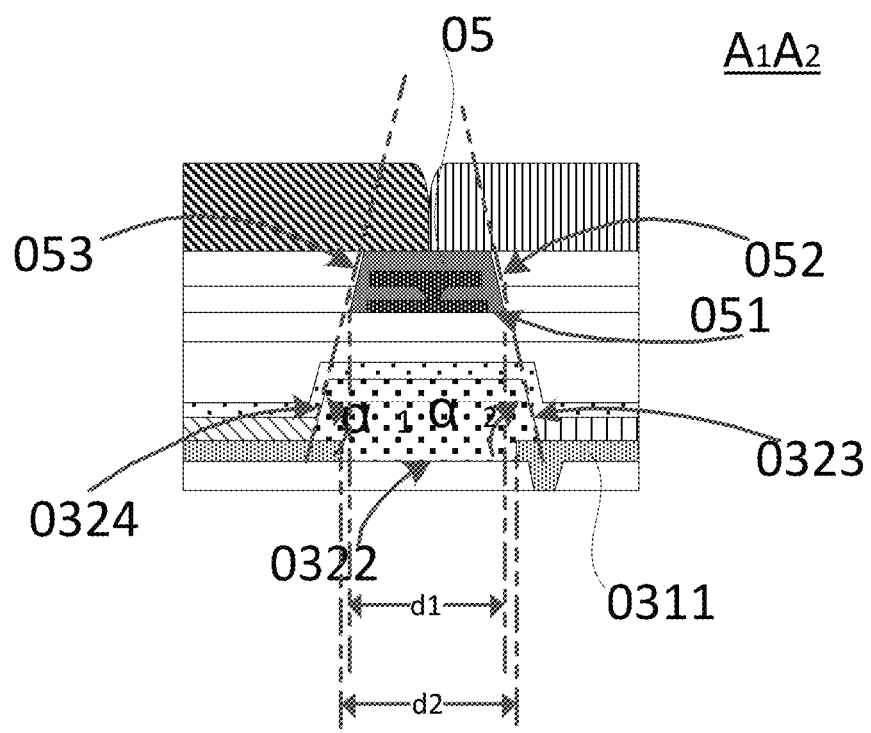
FIG. 4 is a partial enlarged schematic diagram of $A_1A_2$ region in the display panel shown in FIG. 3.

FIG. 2 is a schematic diagram showing a display panel according to an embodiment of the present disclosure. FIG. 3 is a schematic diagram showing a display panel according to another embodiment of the present disclosure. FIG. 4 is a partial enlarged schematic diagram of an $A_1A_2$ region in the display panel shown in FIG. 3.

Referring to FIG. 2 and FIG. 3, the display panel 00 includes an array substrate 01; a light-emitting layer 03 located at a side of the array substrate 01, the light-emitting layer 03 includes a plurality of light-emitting units; a touch dielectric layer 04 located at a side of the light-emitting layer 03 facing away from the array substrate 01. The touch dielectric layer 04 includes a plurality of first apertures 041. An orthographic projection of the first apertures 041 on the light-emitting layer 03 is located between two adjacent light-emitting units 031. In an embodiment of the present disclosure, the array substrate 01 sequentially includes an underlay 011, a buffer layer 012 and an array functional layer 013. The array functional layer 013 includes a plurality of thin film transistors for driving the light-emitting unit to perform display function. In an embodiment of the present disclosure, the thin film transistor includes a source/drain electrode S/D, a gate electrode G, and an active layer A. The present disclosure only schematically illustrates a technical solution in which only one thin film transistor is shown. It may be understood that there may be any number of thin film transistors, and the specific number may be set according to specific requirements of the display panel, which is not specifically limited in this embodiment.

In an embodiment of the present disclosure, the light-emitting layer 03 includes an anode 0311, a light-emitting layer 0312, and a cathode 0313. The anode 0311 includes ITO/Ag/ITO, and the cathode 0313 includes magnesium-silver alloy. In an embodiment of the present disclosure, the light-emitting unit 031 includes an organic light-emitting unit, an LED light-emitting unit or a quantum dot light-emitting unit.

In an embodiment of the present disclosure, the display panel 00 further includes a thin film encapsulation layer 02. The thin film encapsulation layer 02 is located between the light-emitting layer 03 and the touch dielectric layer. The thin film encapsulation layer 02 may include one, two, or more than two film layers, and may include organic layers and inorganic layers that are alternately arranged. In the display panel provided by this embodiment, the underlay 011 is a flexible substrate, which may be bendable. The film encapsulation layer 02 has good bendability. The display panel provided by this embodiment may be bent or folded. Materials and film structures of the thin film encapsulation layer 02 are not limited in this embodiment.

Referring to FIG. 2 and FIG. 3, the display panel 00 further includes: a black matrix 05 located within the first aperture 041 of the touch dielectric layer 04; and a color filter layer 06 located at a side of the touch dielectric layer 04 facing away from the array substrate 01. The color filter layer 06 includes a plurality of color filter units 061. The color filter unit 061 is arranged in a one-to-one correspondence to the light-emitting units 031. On one hand, replacing the traditional polarizer with the black matrix and color filter layer reduces the thickness of the display panel to increase flexibility of the display panel and, at the same time, increases the light transmittance so as to enhance the luminance of the entire display panel. On the other hand, providing the black matrix in the first aperture of the touch dielectric layer may eliminate the horn defect of the color filter material at the edge of the color filter unit due to presence of the black matrix in a coating process. That is to say, flatness of the color filter layer in the present disclosure is improved compared to the related art, and improving luminance at a large view angle may reduce color deviation in display view angle of the display panel and reduce color dispersion of the ambient light reflected by the display panel. Moreover, providing the black matrix in the first aperture of the touch dielectric layer reduces a vertical distance between the light-emitting unit of the display panel and the surrounding black matrix above the light-emitting unit without affecting light emission at a large view angle.

It is appreciated that the vertical distance may be understood as a distance in a direction perpendicular to the plane of the display panel and towards a light-exiting surface of the display panel, that is, the direction X in FIG. 2 and FIG. 3.

In an embodiment of the present disclosure, the display panel further includes a pixel definition layer located between the array substrate and the touch dielectric layer. The pixel definition layer includes a plurality of second apertures in which the light-emitting unit is located. The second aperture is arranged in one-to-one correspondence to the light-emitting unit. In a first direction, the first aperture does not overlap with the second aperture. The first direction is perpendicular to the plane of the display panel and towards a light-exiting surface of the display panel.

In an embodiment of the present disclosure, the display panel further includes a color filter dielectric layer 07 located at a side of the color filter layer 06 facing away from the array substrate. The color filter dielectric layer 07 may further flatten the surface of the color filter layer. In addition, the color filter dielectric layer 07 is used as a protective layer above the color filter layer to prevent the color filter unit from being scratched during the subsequent manufacturing process or bonding process, which may cause new display problems.

Referring to FIGS. 2 and 3, the display panel further includes a pixel definition layer 032 located between the array substrate 01 and the touch dielectric layer 04. The pixel definition layer 032 includes a second aperture 0321, the light-emitting unit 031 is located within the second aperture 0321, and the second aperture 0321 is arranged in one-to-one correspondence to the light-emitting unit 031. In the first direction X, the first aperture 041 does not overlap with the second aperture 0321. The first direction X is perpendicular to the plane of the display panel and towards a light-exiting surface of the display panel. It is appreciated that the black matrix 05 fills the first aperture 041, the light-emitting unit 031 is located within the second aperture 0321, and the first aperture 041 does not overlap with the second aperture 0321, that is, the black matrix 05 does not overlap with the light-emitting unit 031 in the first direction, and the black matrix 05 is located within a non-aperture region of the pixel definition layer. Such an arrangement may not affect normal light emission of the light-emitting unit 031.

In an embodiment of the present disclosure, referring to FIG. 4, a maximum width of the black matrix 05 between two adjacent light-emitting units is defined as d1, the light-emitting unit includes a plurality of anodes 0311, a shortest distance d2 between two adjacent anodes 0311 is defined as d2, where d2≥d1. The anode 0311 of the light-emitting unit has a certain reflection effect to the light emitted from a side of the light-emitting layer 0312 facing the anode, so that the anode 0311 may improve light-emitting efficiency of the light-emitting unit to a certain extent. Therefore, d2≥d1, the black matrix 05 may not shield the light emitted from the light-emitting unit and reflected from the anode below, thereby improving the light-emitting efficiency of the light-emitting unit.

In an embodiment of the present disclosure, the display panel includes a touch function layer located between the touch dielectric layer and the light-emitting layer. The touch function layer includes a plurality of touch electrodes, and a touch insulation layer between the touch electrodes. An orthographic projection of the black matrix on the array substrate covers an orthographic projection of the touch electrode on the array substrate.

Referring to FIGS. 3 and 4, the display panel 00 includes a touch function layer 08 located between the touch dielectric layer 04 and the light-emitting layer 03. The touch function layer 08 includes a touch electrode 081 and a touch insulation layer 082. The touch electrode 081 includes a sensing touch electrode and a driving touch electrode (not labeled in the figures), which collectively realize the touch function of the display panel. The touch insulation layer 082 is configured to sense the touch electrode and the driving touch electrode in an insulated manner. In an embodiment, the touch function layer 08 includes a touch buffer layer 083 at a side close to the light-emitting layer 03. The touch buffer layer 083 is configured to support the touch electrode layer, and provide a manufacturing environment for the touch electrode layer 081 directly integrated to the display panel 00. In an embodiment, the touch buffer layer 083 is an inorganic layer.

Referring to FIGS. 3 and 4, an orthographic projection of the black matrix 05 on the array substrate 01 covers an orthographic projection of the touch electrode 081 on the array substrate 01. The orthographic projection area of the black matrix 05 on the array substrate 01 is greater than the orthographic projection area of the touch electrode 081 on the array substrate 01. The black matrix 05 is arranged at a side of the touch electrode 081 facing away from the array substrate 01 so that the black matrix 05 covers the touch electrode 081, thereby effectively preventing the touch electrode from being visible due to reflection of the metal, and reducing reflection of the display panel to the ambient light in a dark state. Further, the touch dielectric layer 04 is located at a side of the touch function layer 08 facing away from the array substrate 01, that is, in the first direction X, the touch dielectric layer 04 covers the touch function layer 08. In an embodiment of the present disclosure, the touch dielectric layer 04 is an organic layer. The organic layer has a certain flattening function, which may reduce or eliminate segment gap caused by the touch electrode.

Referring to 4, the pixel definition layer 032 includes a first bottom surface 0322 at a side close to the array substrate, a first side surface 0324 and a second side surface 0323 that are close to the second aperture 0321. An angle between the plane of the first bottom surface 0322 and the plane of the first side surface 0324 is defined as $\alpha 1$, and an angle between the plane of the first bottom surface 0322 and the plane of the second side surface 0323 is defined as $\alpha 2$. The black matrix 05 includes a second bottom surface 051 at a side close to the array substrate, and a third side surface 053 and a fourth side surface 054 at a side that are close to the touch dielectric layer 04. An angle between the plane of the second bottom surface 051 and the plane of the third side surface 053 is defined as $\beta 1$ (not labeled in the drawing), and an angle between the plane of the second bottom surface 051 is located and the plane of the fourth side surface 054 is located is defined as $\beta 2$ (not labeled in the drawing). In an embodiment, the angles $\alpha 1$, $\beta 1$, $\alpha 2$, and $\beta 2$ satisfy: $\alpha 1 = \beta 1$, $\alpha 2 = \beta 2$. The relationship between heights of the black matrix 05 and the pixel definition layer 032 and the angle of the side walls may be configured such that: $\alpha 1 = \beta 1$, $\alpha 2 = \beta 2$. Therefore, the black matrix 05 may not affect normal light emission of the light-emitting unit, thereby maximizing light-emitting efficiency of the display panel. Meanwhile, while not affecting light-emitting efficiency of the light-emitting unit, the width of the black matrix may be set to the maximum, so that the ambient light reflected by the display panel may be blocked or absorbed as much as possible, thereby improving anti-reflection capacity of the display panel.

In an embodiment of the present disclosure, $\alpha 1 = \alpha 2$, inclination angles of the sidewalls of the pixel definition layer of two adjacent light-emitting units are the same, so that the maximum light-emitting angles of the light-emitting units are the same, thereby preventing occurrence of color deviation of the display panel caused by different set angle of the second aperture 0321 of the pixel definition layer 032 affecting the difference in the light-emitting efficiency of the light-emitting units of different colors.

In an embodiment of the present disclosure, the touch dielectric layer includes a first surface and a second surface that are opposite to each other. The first surface is a surface of the touch dielectric layer at a side close to the array substrate, and the second surface is a surface of the touch dielectric layer at a side facing away from the array substrate. At least one of the first surface and the second surface includes a groove recessed toward the other of the first surface and the second surface. The groove forms the first aperture.

Figure 5:
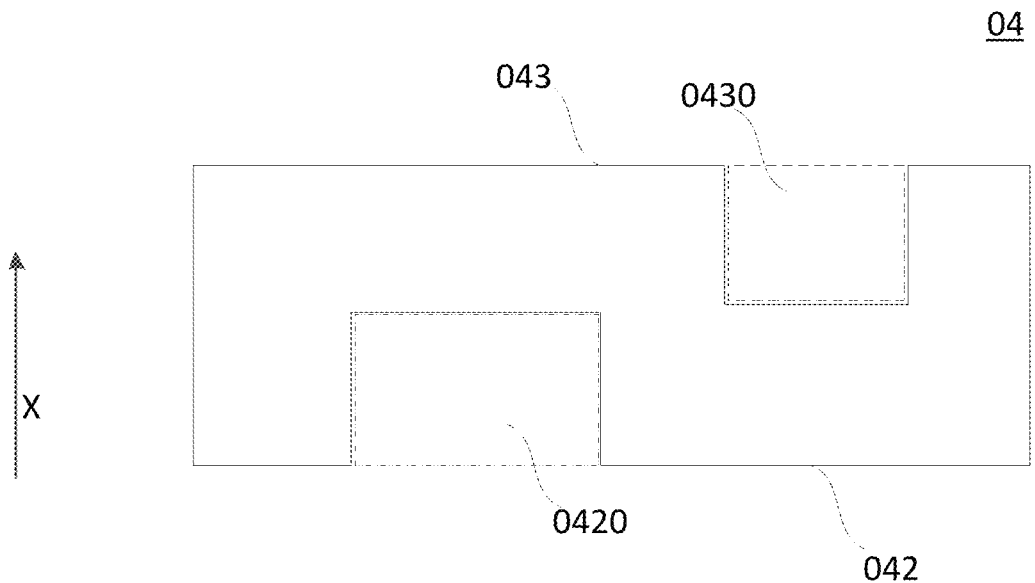
FIG. 5 is a schematic diagram showing a touch dielectric layer in the display panel according to an embodiment of the present disclosure.
Figure 6:
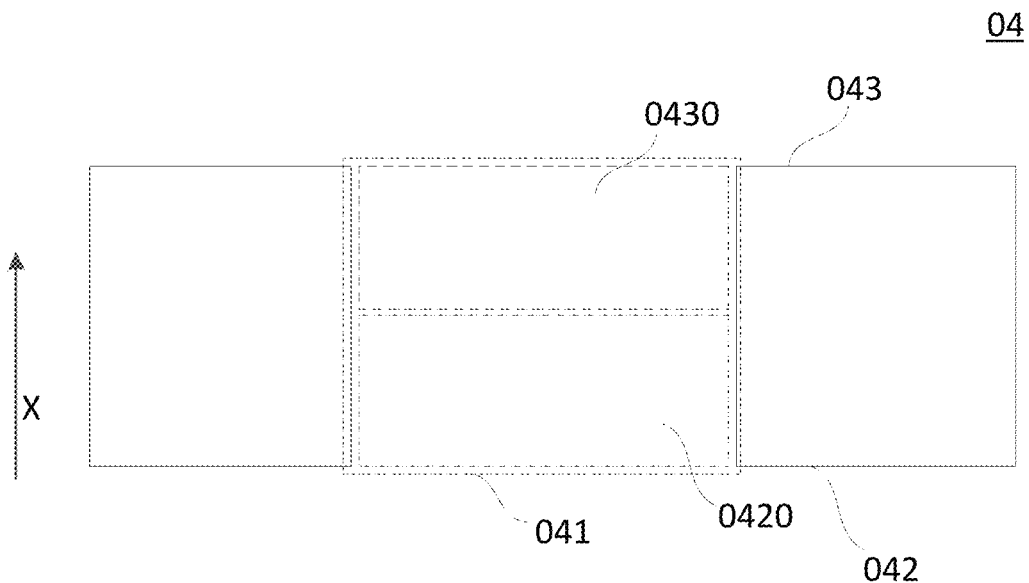
FIG. 6 is a schematic diagram showing a touch dielectric layer in the display panel according to another embodiment of the present disclosure.

FIG. 5 is a schematic diagram showing a touch dielectric layer in the display panel according to an embodiment of the present disclosure. FIG. 6 is a schematic diagram showing a touch dielectric layer in the display panel according to another embodiment of the present disclosure. As shown in FIGS. 3, 5, and 6, the touch dielectric layer 04 includes a first surface 042 and a second surface 043 that are opposite to each other. The first surface 042 is a surface of the touch dielectric layer 04 at a side close to the array substrate 01. The second surface 043 is a surface of the touch dielectric layer 04 at a side facing away from the array substrate. At least one of the first surface 042 and the second surface 043 includes a groove recessed toward the other of the first surface 042 and the second surface 043. The groove forms the first aperture 041. It is appreciated that the first surface 042 includes a groove, the groove of the first surface 042 is a first groove 0420, and the first groove 0420 is recessed toward the second surface 043, and/or, the second surface 043 includes a groove, the groove of the second surface 043 is a second groove 0430, and the second groove 0430 is recessed toward one side of the first surface 042. When only the first surface 042 of the touch dielectric layer 04 includes a first groove, the first groove 0420 forms a first aperture 041. When only the second surface 043 of the touch dielectric layer 04 includes a second groove 0430, the second groove 0430 forms a first aperture 041. When the first surface 042 and the second surface 043 of the touch dielectric layer 04 include a first groove 0420 and a second groove 0430, respectively, the first groove 0420 and the second groove 0430 may jointly form the first aperture 041.

In an embodiment of the present disclosure, the first surface includes a groove, the groove on the first surface is a first groove, and a black matrix fills the first groove. In the first direction, the depth of the first groove is less than that of the maximum thickness of the touch dielectric layer. The first direction is perpendicular to the plane of the display panel and towards the light-exiting surface of the display panel.

Figure 7:
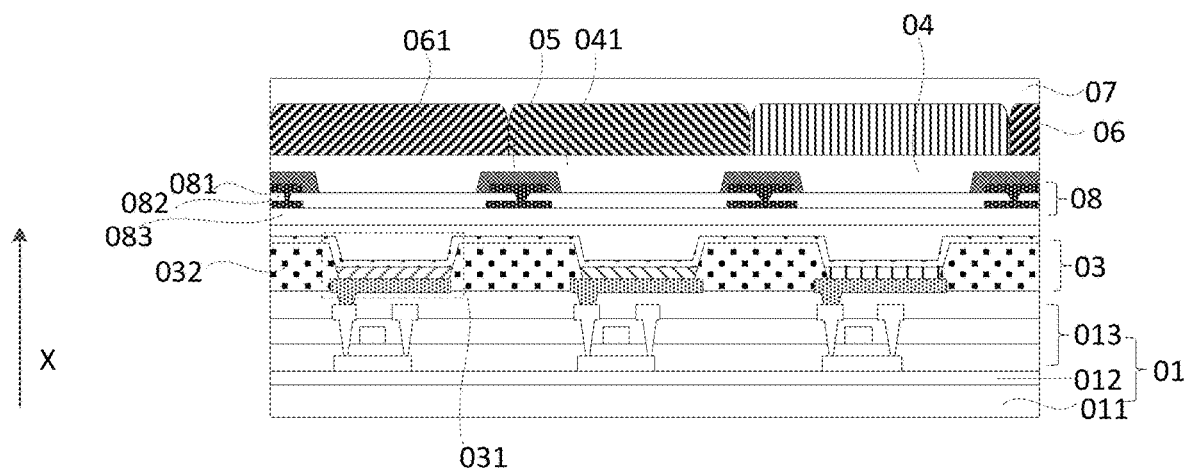
FIG. 7 is a schematic diagram showing a display panel according to yet another embodiment of the present disclosure.
Figure 8:
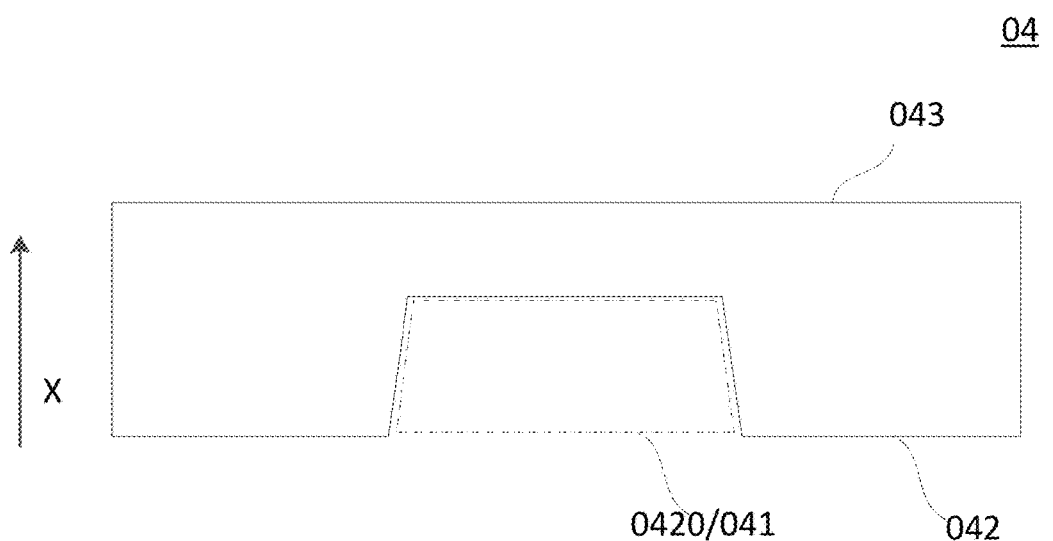
FIG. 8 is a schematic diagram showing a touch dielectric layer in the display panel corresponding to FIG. 7.
Figure 9:
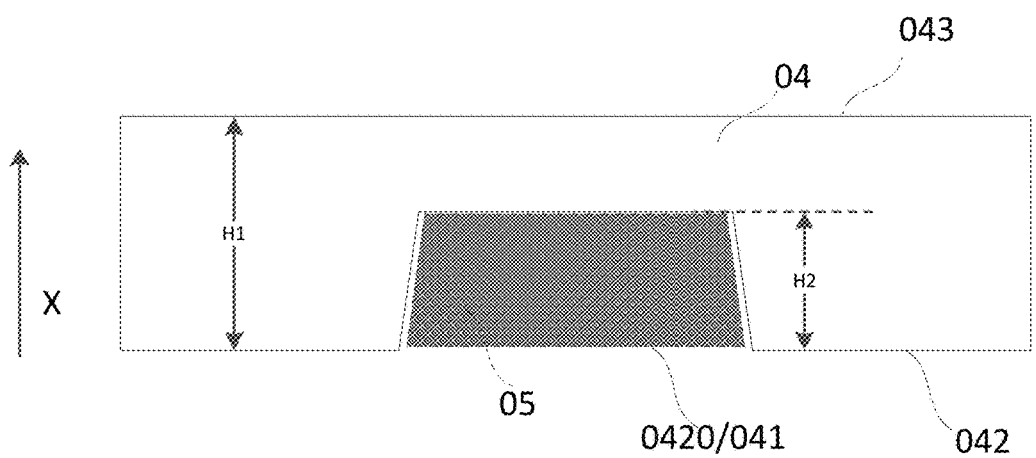
FIG. 9 is a schematic diagram showing a black matrix in the display panel corresponding to FIG. 7.

FIG. 7 is a schematic diagram showing a display panel according to yet another embodiment of the present disclosure. FIG. 8 is a schematic diagram showing a touch dielectric layer in the display panel corresponding to FIG. 7. FIG. 9 is a schematic diagram showing a black matrix in the display panel corresponding to FIG. 7. As shown in FIGS. 7-9, the first surface 042 of the touch dielectric layer 04 includes a first groove 0420, and a black matrix 05 fills the first groove 0420. That is, a first aperture 041 is formed by the first groove 0420 of the first surface 042, and the black matrix 05 fills the first groove 0420 (first aperture 041). The touch dielectric layer 04 covers the black matrix 05 along a direction facing away from the light-exiting surface of the display panel 00 (the opposite direction of the first direction). In the first direction X, the depth H2 of the first groove 0420 is less than the maximum thickness H1 of the touch dielectric layer 04. The first direction X is perpendicular to the plane of the display panel and towards the light-exiting surface of the display panel. H1>H2 may achieve that a portion of the touch dielectric layer 04 covers the black matrix in a direction opposite to the first direction X. When the color filter layer is subsequently prepared on the touch dielectric layer 04, the touch dielectric layer is used as the color filter layer to coat a carrier substrate during the color filter material coating process. Since the lower carrier substrate is formed with the touch dielectric layer 04, their materials are the same, so that the materials have the same hydrophobic property. Therefore, the color filter material coating process will not result in a difference in the flow rate of the color filter materials caused by property difference of the underlying carrier substrate materials, thereby avoiding influence of the different carrier substrate materials on flatness of the color filter layer.

It should be noted that in the drawings, the same structures and reference signs in the drawings will not be elaborated herein.

In an embodiment of the present disclosure, the second surface includes a groove being a second groove. A black matrix fills the second groove. In a first direction, a depth of the second groove is less than a maximum thickness of the touch dielectric layer. The first direction is perpendicular to the plane of the display panel and towards a light-exiting surface of the display panel.

Figure 10:
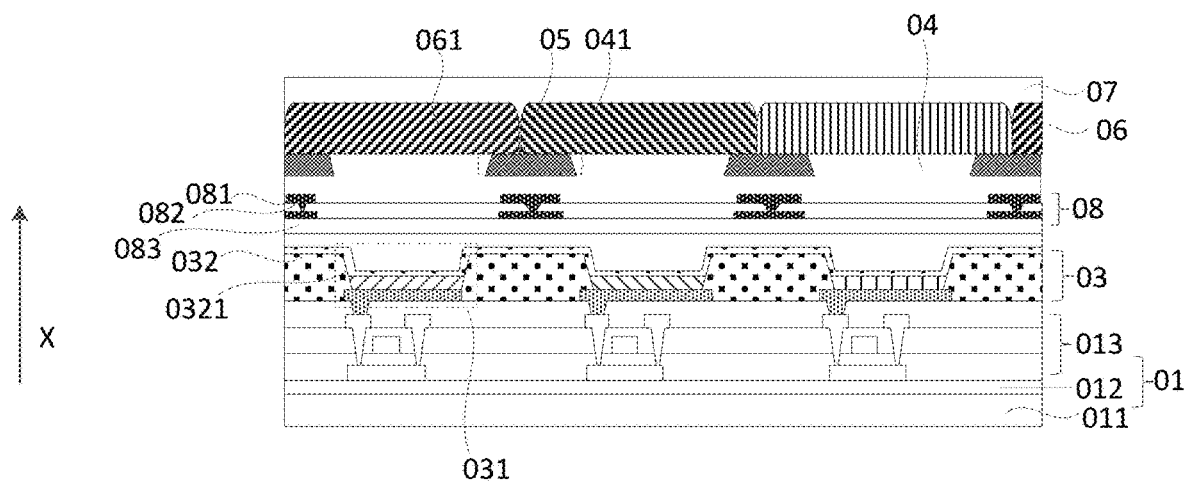
FIG. 10 is a schematic diagram a display panel according to yet still another embodiment of the present disclosure.
Figure 11:
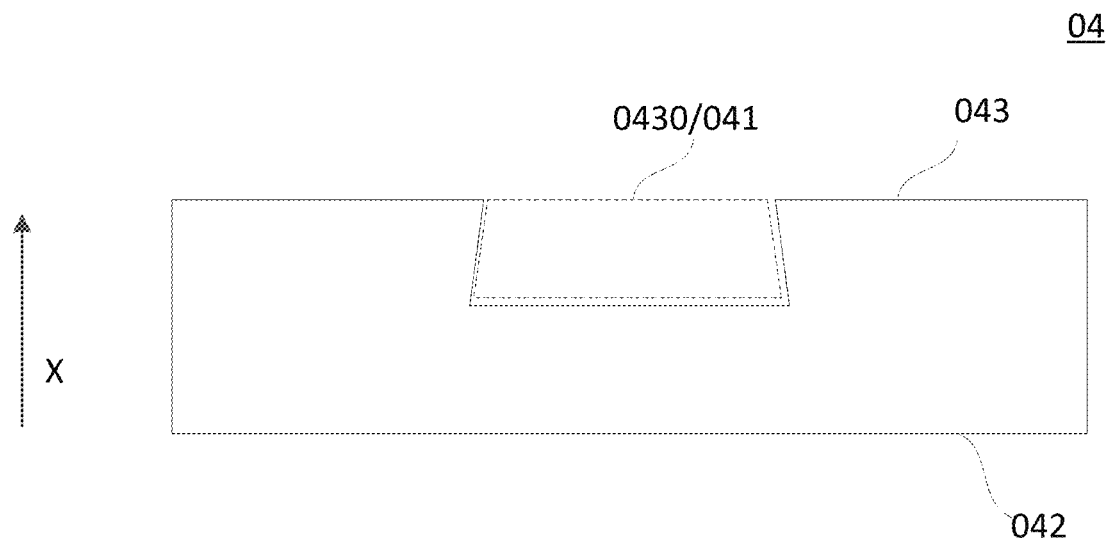
FIG. 11 is a schematic diagram showing a touch dielectric layer in the display panel corresponding to FIG. 10.
Figure 12:
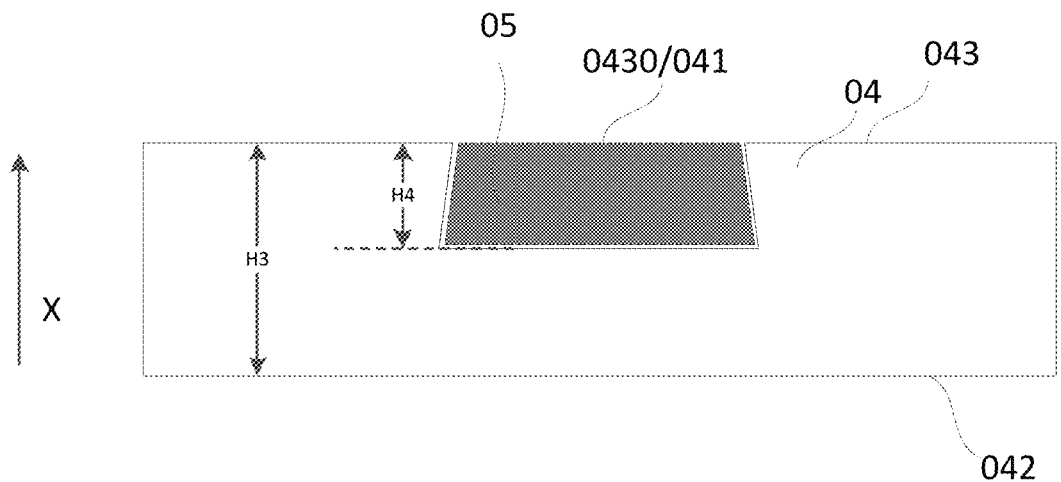
FIG. 12 is a schematic diagram showing a black matrix in the display panel corresponding to FIG. 10.

FIG. 10 is a schematic diagram a display panel according to yet still another embodiment of the present disclosure. FIG. 11 is a schematic diagram showing a touch dielectric layer in the display panel corresponding to FIG. 10. FIG. 12 is a schematic diagram showing a black matrix in the display panel corresponding to FIG. 10. Referring to FIGS. 10 to 12, the second surface 043 of the touch dielectric layer 04 includes a second groove 0430, and a black matrix 05 fills the second groove 0430. That is, a first aperture 041 is formed by the second groove 0430 of the second surface 043, and the black matrix 05 fills the second groove 0430 (first aperture 041). The touch dielectric layer 04 covers the black matrix 05 along the first direction. In the first direction X, the depth H4 of the second groove 0430 is less than the maximum thickness H3 of the touch dielectric layer 04. The first direction X is perpendicular to the plane of the display panel and towards the light-exiting surface of the display panel. H3>H4, referring to FIG. 10, that is, a portion of the touch dielectric layer 04 is also included between the touch electrode 081 and the black matrix 05, so that the touch electrode 081 does not directly contact with the black matrix 05. When the touch electrode 081 is a metal touch electrode, direct contact between the touch electrode 081 and the black matrix 05 may tend to cause film peeling between the black matrix 05 and the touch electrode 081. By providing the touch dielectric layer 04 between the touch electrode 081 and the black matrix 05, since the touch dielectric layer 04 includes an organic layer, the touch dielectric layer may effectively improve adhesion between the touch electrode 081 and the black matrix 05, and prevent the black matrix 05 from peeling off from the underlying film layer which may cause cracks in the display panel.

In an embodiment of the present disclosure, the first surface and the second surface each include a groove, the groove on the first surface is a first groove, and the groove on the second surface is a second groove. In a first direction, the first groove overlaps the second groove. The first groove and the second groove run through the touch dielectric layer and form the first aperture. The first direction is perpendicular to the plane of the display panel and towards a light-exiting surface of the display panel.

Figure 13:
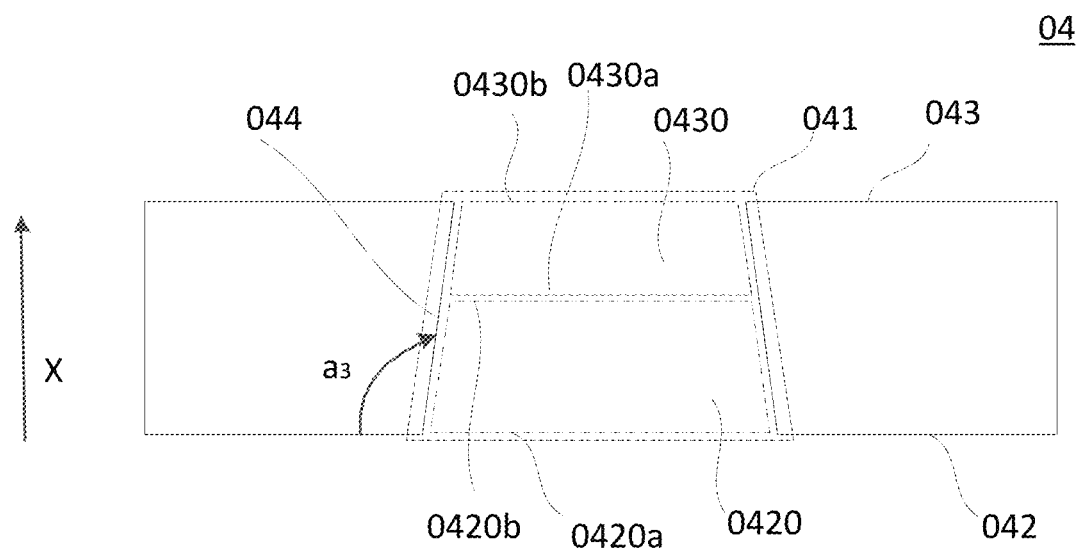
FIG. 13 is a schematic diagram showing a touch dielectric layer in the display panel corresponding to FIG. 3 according to another embodiment of the present disclosure.

FIG. 13 is a schematic diagram showing a touch dielectric layer in the display panel corresponding to FIG. 3 according to still another embodiment of the present disclosure. As shown in FIGS. 3 and 13, the first surface 042 of the touch dielectric layer 04 includes a first groove 0420, and the second surface 043 of the touch dielectric layer 04 includes a second groove 0430. In the first direction X, the first groove 0420 overlaps the second groove 0430. The first groove 0420 and the second groove 0430 run through the touch dielectric layer 04. The first groove 0420 and the second groove 0430 form a first aperture 041. It may be understood that the first groove 0420 and the second groove 0430 jointly forms the first aperture 041. Along the first direction X, the first aperture 041 runs through the touch dielectric layer 04.

Referring to FIG. 13, a surface of the touch dielectric layer 04 close to the first aperture 041 is a fifth side wall 044. An angle between the plane of the fifth side wall 044 is located and the plane of the second side surface 042 is located is defined as α3, in which α3≥90°. FIG. 13 shows the case where α3 is greater than 90°. Matching the first aperture 041 greater than 90° with the second aperture of the pixel definition layer below is beneficial to improving light-emitting efficiency of the light-emitting unit. In addition, FIG. 6 shows the situation where α3 is equal to 90°, i.e., α3=90°. The areas of the first aperture 041 in the cross section parallel to the plane of the array substrate 01 and passing through the first aperture 041 are the same, so that the flow rate may not change too much during preparation of the black matrix, thereby improving controllability of the black matrix coating process.

In an embodiment of the present disclosure, the black matrix fills the first groove and the second groove. Along the first direction, the maximum thickness of the black matrix is equal to the maximum thickness of the touch dielectric layer.

Figure 14:
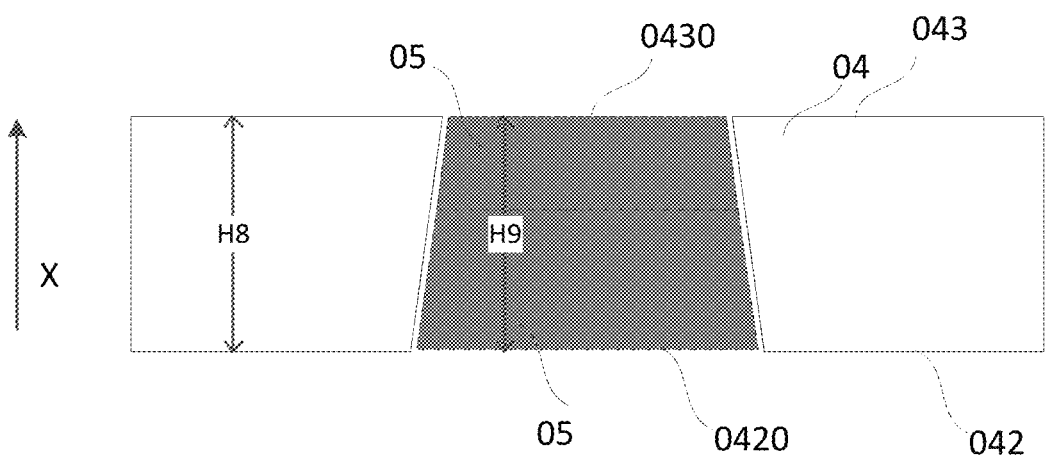
FIG. 14 is a schematic diagram showing a black matrix in the display panel corresponding to FIG. 3.

FIG. 14 is a schematic diagram showing a black matrix in the display panel corresponding to FIG. 3. As shown in FIG. 14, the first groove 0420 and the second groove 0430 jointly form the first aperture 041, and the black matrix 05 fills the first groove 0420 and the second groove 0430. The maximum thickness H9 of the black matrix 05 is equal to the maximum thickness H8 of the touch dielectric layer 04. It is appreciated that the surface of the black matrix 05 facing away from the array substrate 01 is flush with the second surface 043 of the touch dielectric layer 04, and the black matrix 05 and the touch dielectric layer 04 are collectively used as a support substrate of the color filter layer, and H8=H9, so that the completely flush surface is beneficial to improve flatness of the color filter layer coated.

In an embodiment of the present disclosure, the black matrix fills the first groove. Along a first direction, the maximum thickness of the black matrix is less than that of the touch dielectric layer. A portion of the color filter units fills the second groove.

Figure 15:
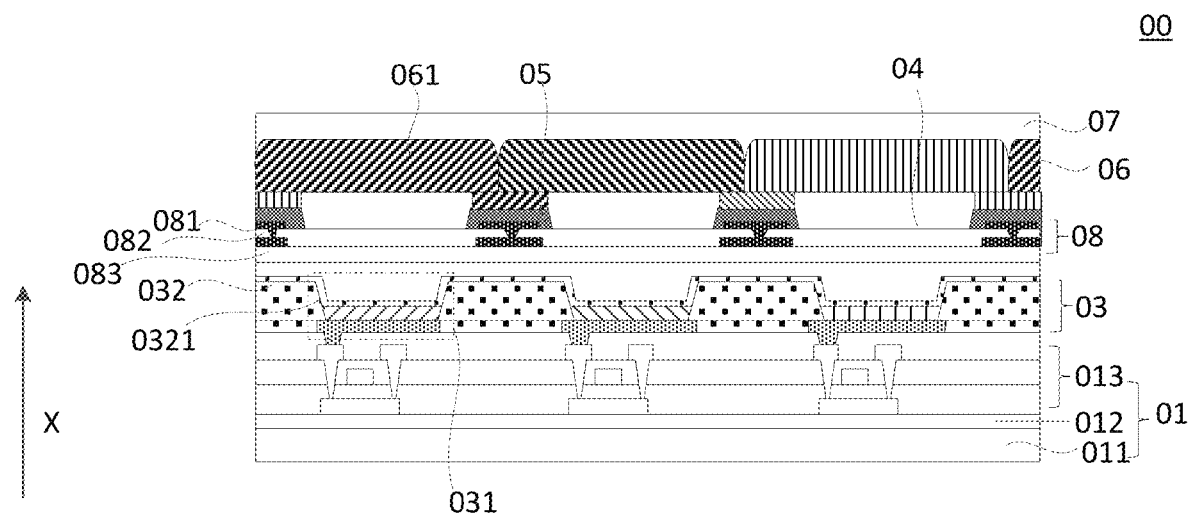
FIG. 15 is a schematic diagram showing a display panel according to yet still another embodiment of the present disclosure.
Figure 16:
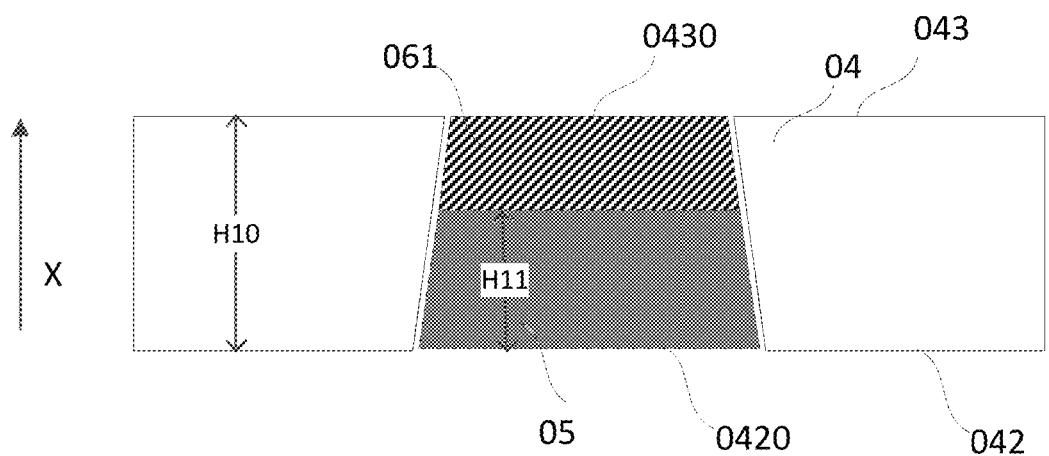
FIG. 16 is a schematic diagram showing a region where the black matrix in the display panel corresponding to FIG. 15 is located.

FIG. 15 is a schematic diagram showing a display panel according to yet still another embodiment of the present disclosure. FIG. 16 is a schematic diagram showing a region where the black matrix in the display panel corresponding to FIG. 15 is located. As shown in FIGS. 15 and 16, the black matrix 05 fills the first groove 0420. Along the first direction X, the maximum thickness H11 of the black matrix 05 is less than the maximum thickness H10 of the touch dielectric layer 04. A portion of the color filter units 061 may fill in the second groove 0430. Since there is an overlapping region between two adjacent color filter units 061, the overlapping region overlaps the black matrix 05 in the first direction X. When the color filter material is coated to form the color filter unit 061, there may be protrusions in the overlapping region. In order to avoid the color filter unit 061 from forming new protrusions in the overlapping region, the second groove 0430 is used to reserve an accommodating space for the color filter overlapping region so as to avoid display non-uniformity caused by the new protrusions. When the thickness of the color filter unit 061 above the black matrix 05 is reduced, a propagation distance of light passing through the color filter unit 061 under a large view angle may be reduced, and view angle color deviation under a large view angle and a front view angle may be further reduced. In an embodiment, along the first direction X, a depth of the second groove 0430 is less than or equal to 0.96 Generally, due to presence of the black matrix, a difference between the thickness of the color filter unit around the black matrix and the thickness of the color filter unit at a center region is about 1.2 μm in a process for manufacturing the color filter unit, the depth of the second groove 0430 is less than or equal to 80% of the thickness difference of the color filter unit caused by the horn defects. Arranging the black matrix in the first aperture of the touch dielectric layer may alleviate the horn phenomenon of the color filter unit, so that the depth of the second groove in this embodiment shall not be too large, thereby avoiding new color deviation problems caused by a great reduction in a distance of the light with a large view angle passing through the color filter unit.

In an embodiment of the present disclosure, in the first direction X, the black matrix 05 has a thickness in a range from 1 μm to 2 μm, and the color filter unit 061 has a thickness in a range from 2 μm to 5 μm.

In an embodiment of the present disclosure, the first groove includes a first sub-surface and a second sub-surface. The first sub-surface is a surface of the first groove at a side close to the array substrate, and the second sub-surface is a surface of the first groove at a side facing away from the array substrate. The second groove includes a third sub-surface and a fourth sub-surface. The third sub-surface is a surface of the second groove at a side close to the array substrate, and the fourth sub-surface is a surface of the second groove at a side facing away from the array substrate. An orthographic projection of the third sub-surface on the array substrate coincides with an orthographic projection of the second sub-surface on the array substrate.

Figure 17:
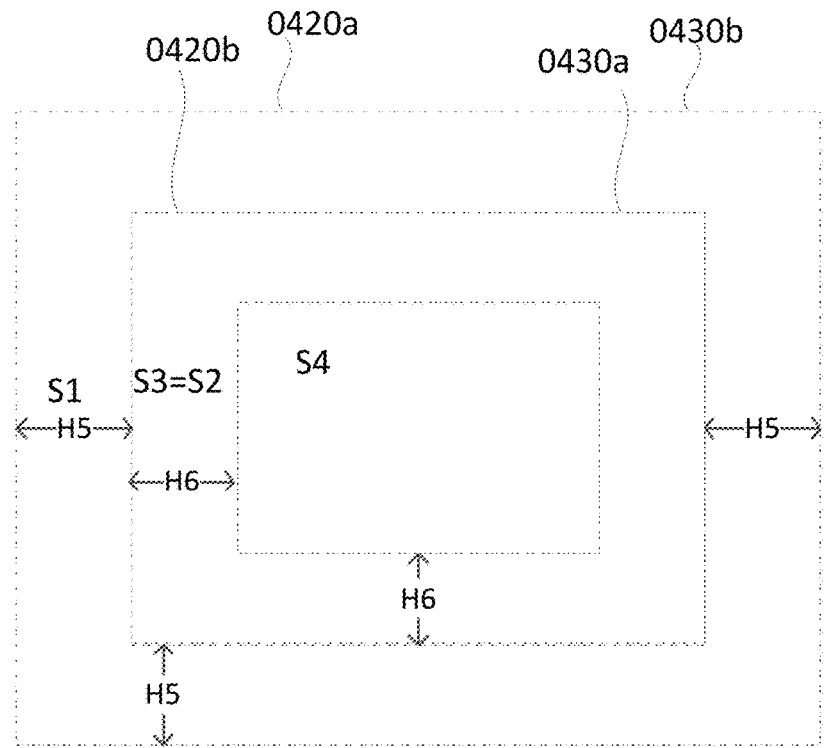
FIG. 17 is a schematic diagram showing a partial projection of the touch dielectric layer of the display panel shown in FIG. 13.

FIG. 17 is a schematic diagram showing a partial projection of the touch dielectric layer of the display panel shown in FIG. 13. As shown in FIGS. 3, 13 and 17, the first surface 042 of the touch dielectric layer 04 includes a first groove 0420. The first groove 0420 includes a first sub-surface 0420a and a second sub-surface 0420b. The surface 0420a is a surface of the first groove 0420 at a side close to the array substrate 01, and the second sub-surface 0420b is a surface of the first groove 0420 at a side facing away from the array substrate 01. The second groove 0430 includes a third sub-surface 0430a and a fourth sub-surface 0430b. The third sub-surface 0430a is a surface of the second groove 0430 at a side close to the array substrate 01, and the fourth sub-surface 0430b is a surface of the second groove 0430 at a side facing away from the array substrate 01. Referring to FIG. 17, an orthographic projection of the third sub-surface 0430a on the array substrate 01 coincides with an orthographic projection of the second sub-surface 0420b on the array substrate 01. That is, the third sub-surface 0430a has the same area as the second sub-surface 0420b. The orthographic projections of the two also coincide with each other, that is, the first groove 0420 has the same area as the second groove 0430 at a contact region therebetween.

In an embodiment of the present disclosure, referring to FIG. 17, an orthographic projection area of the first sub-surface 0420a on the array substrate 01 is defined as S1, an orthographic projection area of the second sub-surface 0420b on the array substrate 01 is defined as S2, an orthographic projection area of the third sub-surface 0430a on the array substrate 01 is defined as S3, and an orthographic projection area of the fourth sub-surface 0430b on the array substrate 01 is defined as S4. The orthographic projection areas S1, S2, S3, and S4 satisfy S1>S2=S3>S4. An aperture size of the first aperture 041 of the touch dielectric layer at a side facing away from the array substrate 01 is smaller than an aperture size of the first aperture 041 at a side close to the array substrate 01. When the first aperture 041 is filled with the black matrix, a bottom area of the black matrix 05 at a side close to the array substrate 01 is larger than a top area of the black matrix 05 at a side facing away from the array substrate 01. Forming the black matrix with a trapezoidal structure may avoid influence of the side walls of the black matrix on light-emitting of the light-emitting unit, increase light-emitting area and improve light-emitting efficiency.

In an embodiment of the present disclosure, distances from an edge of the orthographic projection of the first sub-surface 0420a on the array substrate 01 to an edge of the orthographic projection of the nearest second sub-surface 0420b on the array substrate 01 are equal to each other. Referring to FIG. 17, distances from an edge of the orthographic projection of the first sub-surface 0420a on the array substrate 01 to an edge of the orthographic projection of the nearest second sub-surface 0420b on the array substrate 01 are both H5, and a geometric center of the orthographic projection of the first sub-surface 0420a on the array substrate 01 coincides with a geometric center of the orthographic projection of the second sub-surface 0420b on the array substrate 01, so that the first groove 0420 is formed as an isosceles trapezoid, thereby achieving that the side walls of the first groove 0420 are symmetrically distributed about a symmetry axis of the isosceles trapezoid, which is beneficial to balance light-emitting angle of each light-emitting unit.

In an embodiment of the present disclosure, a distance from an edge of the orthographic projection of the second sub-surface 0420b on the array substrate 01 to an edge of the orthographic projection of the nearest fourth sub-surface 0430b on the array substrate 01 is H6, so that the second groove 0430 is formed as an isosceles trapezoid, thereby achieving that the side walls of the first groove 0420 are symmetrically distributed about a symmetry axis of the isosceles trapezoid. Further, H5=H6, so that the first aperture 041 is formed as an isosceles trapezoid, thereby achieving that the side walls of the first aperture 041 are symmetrically distributed about a symmetry axis of the isosceles trapezoid, which is beneficial to balance light-emitting angle of each light-emitting unit and improve display quality.

Figure 18:
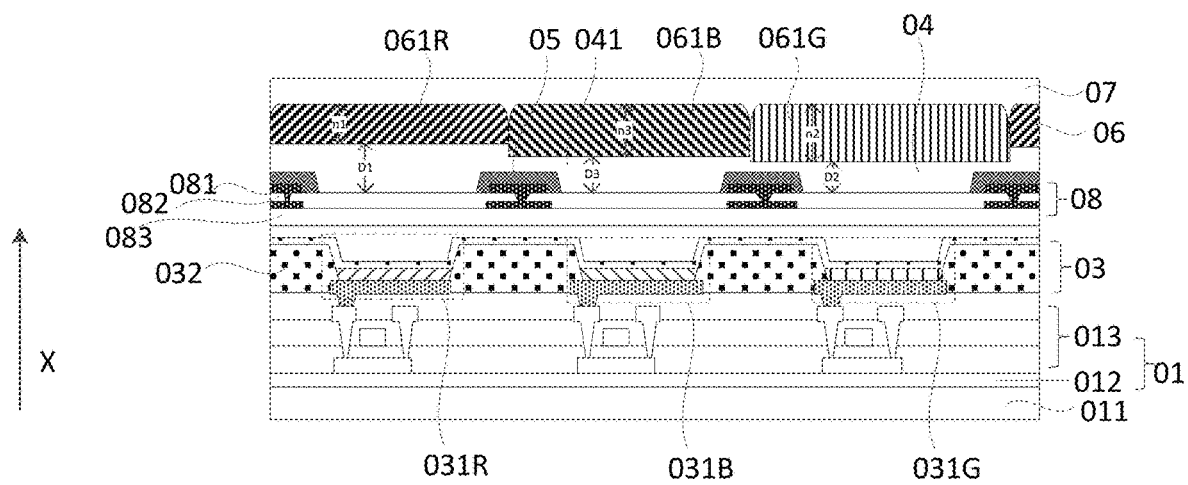
FIG. 18 is a schematic diagram showing a display panel according to yet still another embodiment of the present disclosure.
Figure 19:
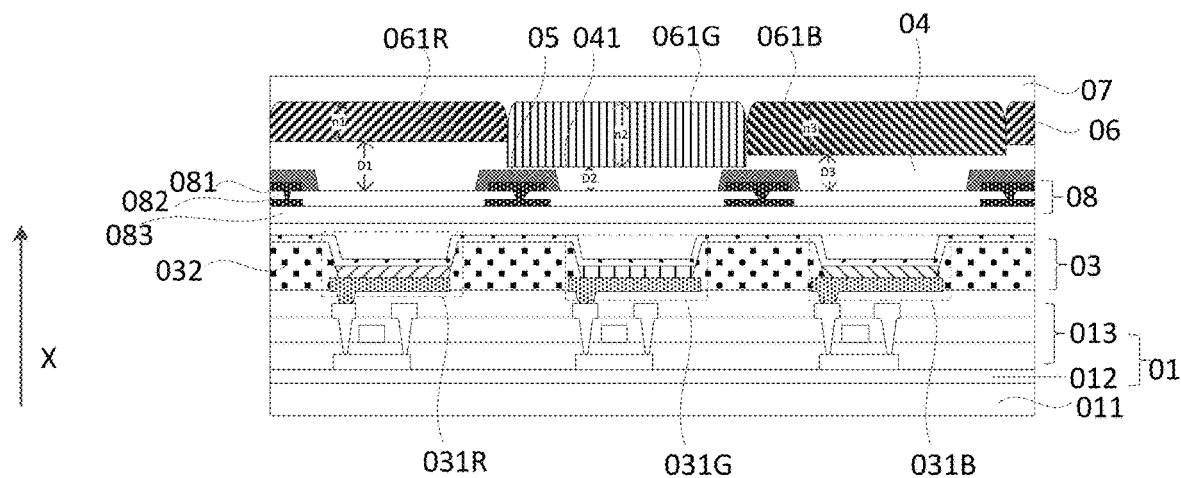
FIG. 19 is a schematic diagram showing a display panel according to yet still another embodiment of the present disclosure.

FIG. 18 is a schematic diagram showing a display panel according to yet still another embodiment of the present disclosure. FIG. 19 is a schematic diagram showing a display panel according to yet still another embodiment of the present disclosure. As shown in FIGS. 18 and 19, the light-emitting unit 031 of the display panel 00 includes a first-color light-emitting unit 031R, a second-color light-emitting unit 031G, and a third-color light-emitting unit 031B. A central wavelength of a first color light is defined as $\lambda 1$. A central wavelength of a second color light is defined as $\lambda 2$. A central wavelength of a third-color light is defined as $\lambda 3$. The central wavelengths $\lambda 1$, $\lambda 2$ and $\lambda 3$ satisfy $\lambda 1 > \lambda 2 > \lambda 3$. The color filter unit 061 includes a first-color color filter unit 061R, a second-color color filter unit 061G, and a third-color color filter unit 061B. The color filter units are arranged corresponding to the light-emitting units of the same color. It is appreciated that the first-color light-emitting unit 031R is arranged corresponding to the first-color color filter unit 061R. In an embodiment of the present disclosure, along the first direction X, the first light-emitting unit 031R overlaps the first-color color filter unit 061R. The second-color light-emitting unit 031G is arranged corresponding to the second-color color filter unit 061G. In an embodiment, along the first direction X, the second-color light-emitting unit 031G overlaps the second-color color filter unit 061G. The third-color light-emitting unit 031B is arranged corresponding to the third-color color filter unit 061B. In an embodiment, along the first direction X, the third light-emitting unit 031B overlaps the third-color color filter unit 061B.

In an embodiment of the present disclosure, the first color has a central wavelength in a range from 620 nm to 630 nm, the second color has a central wavelength in a range from 555 nm to 585 nm, and the third color is has a central wavelength in a range from 440 nm to 480 nm.

Figure 20:
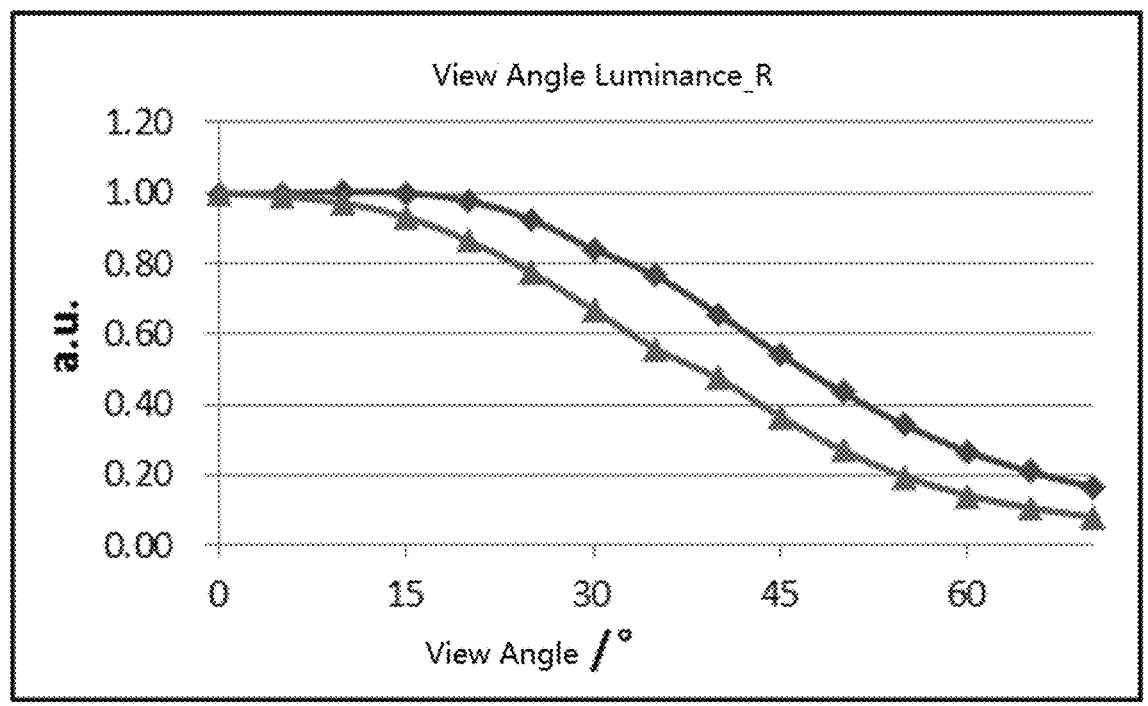
FIG. 20 is a schematic diagram showing luminance attenuation of a first-color light-emitting unit at different view angles.
Figure 21:
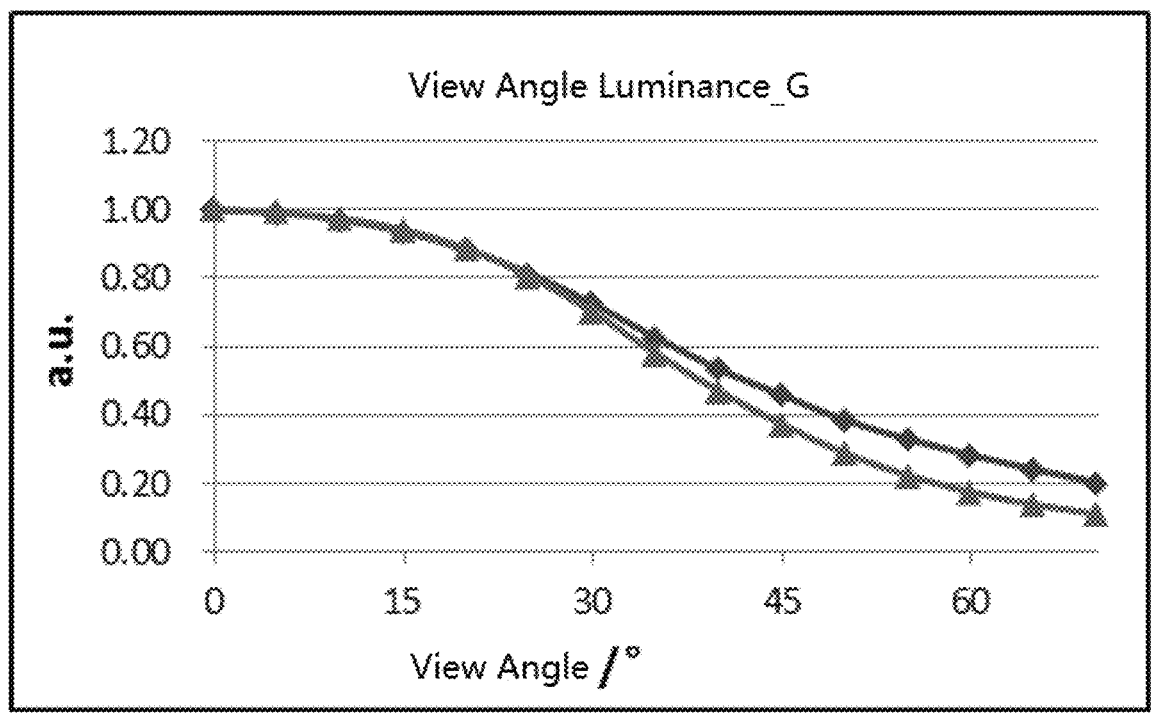
FIG. 21 is a schematic diagram showing luminance attenuation of a second-color light-emitting unit at different view angles.
Figure 22:
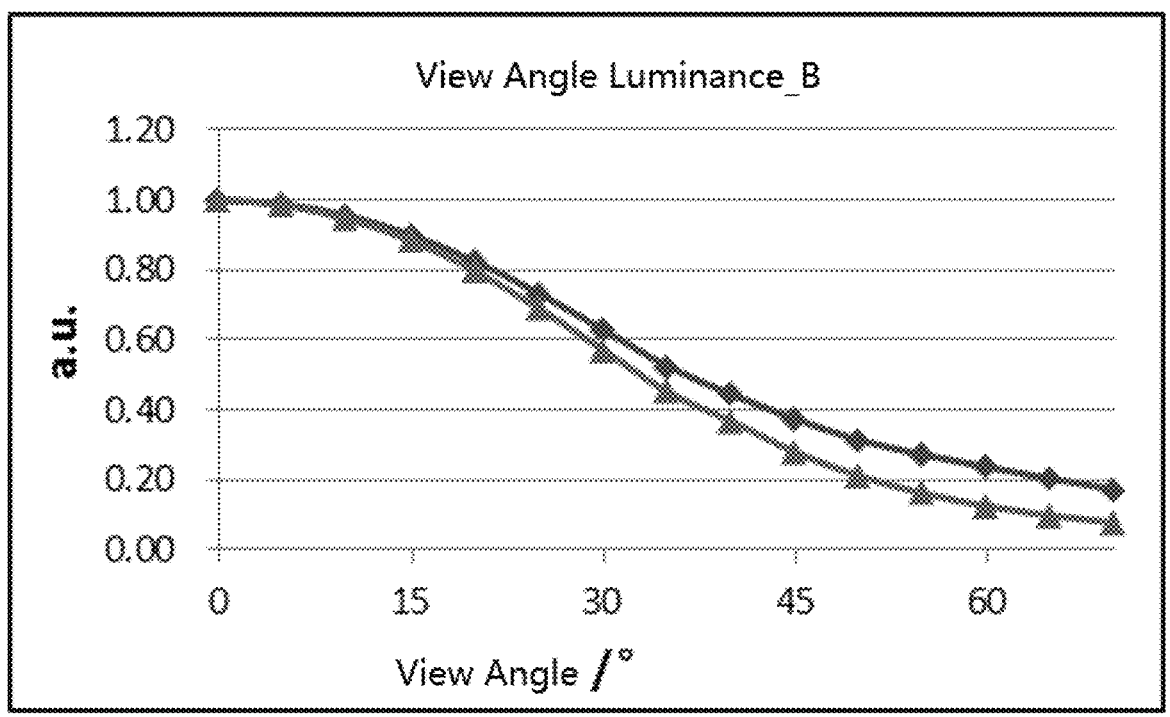
FIG. 22 is a schematic diagram showing luminance attenuation of a third-color light-emitting unit at different view angles.

FIG. 20 is a schematic diagram showing luminance attenuation of a first-color light-emitting unit at different view angles. FIG. 21 is a schematic diagram showing luminance attenuation of a second-color light-emitting unit at different view angles. FIG. 22 is a schematic diagram showing luminance attenuation of a third-color light-emitting unit at different view angles. The applicant found through research that, referring to FIGS. 20-22, under the condition of the same small view angle, the first-color light-emitting unit has the largest attenuation degree, and the third-color light-emitting unit has the smallest attenuation degree. Since the attenuation degree of the light-emitting units of each color is inconsistent, phenomenon of color separation easily occurs that may affect display effect when viewing the display panel from a direction of the display panel.

In an embodiment of the present disclosure, referring to FIGS. 18 and 19, the light-emitting unit 031 of the display panel 00 includes a first-color light-emitting unit 031R, a second-color light-emitting unit 031G, and a third-color light-emitting unit 031B. A central wavelength of the first color light is defined as $\lambda 1$, a central wavelength of the second color light is defined as $\lambda 2$, and a central wavelength of the third color light is defined as $\lambda 3$. The central wavelengths $\lambda 1$, $\lambda 2$ and $\lambda 3$ satisfy $\lambda 1 > \lambda 2 > \lambda 3$. In the first direction X, a thickness of the touch dielectric layer 04 corresponding to the first-color light-emitting unit 031R is defined as D1, a thickness of the touch dielectric layer 04 corresponding to the second-color light-emitting unit 031G is defined as D2, and a thickness of the touch dielectric layer 04 corresponding to the third-color light-emitting unit 031B is defined as D3. The thickness D1, D2 and D3 satisfy $D1 > D3 > D2$.

It should be noted that the first color light represents light emitted by the first-color light-emitting unit, the second color light represents light emitted by the second-color light-emitting unit, and the third color light represents light emitted by the third color.

Figure 23:
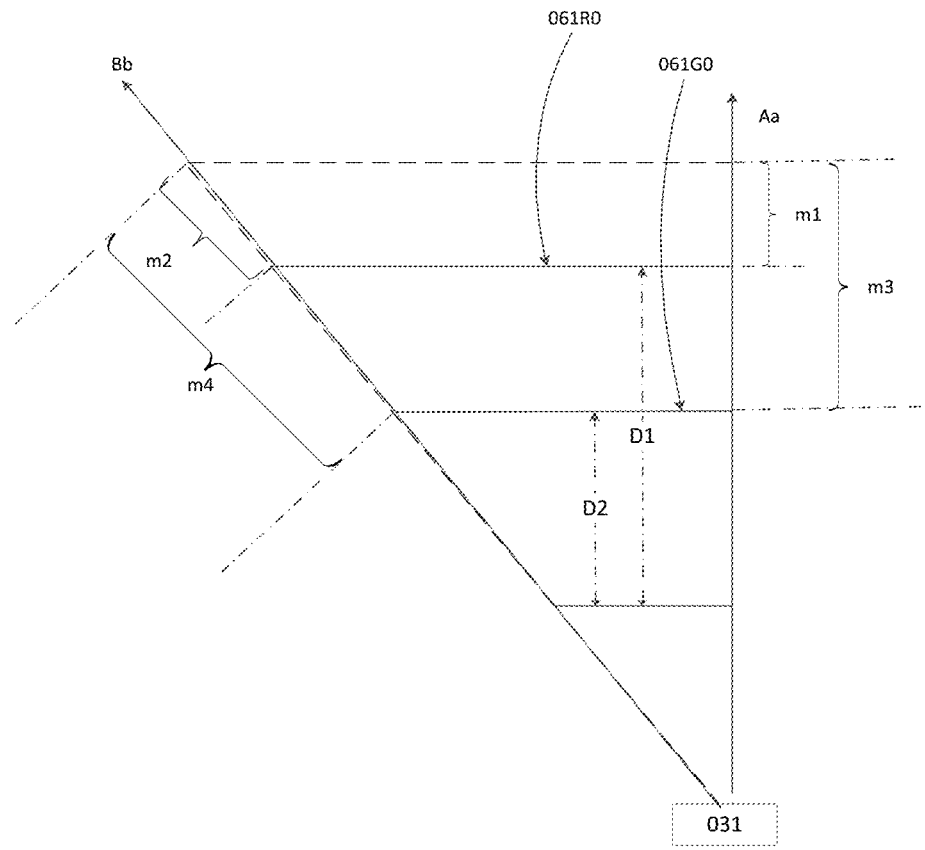
FIG. 23 is a schematic diagram showing luminance attenuation of light emitted by the light-emitting unit in FIG. 18 at different view angles.

FIG. 23 is a schematic diagram showing luminance attenuation of light emitted by the light-emitting unit in FIG. 18 at different view angles. Referring to FIGS. 18 and 23, under a large view angle Bb and a front view angle Aa: a difference between paths of the light emitted by the first-color light-emitting unit 031R through the first-color color filter unit 061R is m2−m1, and a difference between paths of the light emitted by the first-color light-emitting unit 031G through the first-color color filter unit 061G is m4−m3; since D1>D2, it is obvious to obtain (m2−m1)<(m4−m3) according to a graphic similarity principle.

It should be noted that, as shown in FIG. 23, the first-color color filter unit is close to a surface 061R0 of the array substrate 01, and the second-color color filter unit is close to a surface 061B0 of the array substrate 01. FIG. 23 is only a schematic diagram for explaining and not representing actual structure. (m2−m1)<(m4−m3) means that, under the same view angle, the difference between paths of the light emitted by the first-color light-emitting unit 031R through the first-color color filter unit 061R is smaller than the difference between paths of the light emitted by the first-color light-emitting unit 031G through the first-color color filter unit 061G, so that luminance attenuation at the large view angle and the front view angle of the first-color light-emitting unit may be relatively reduced. A difference in luminance attenuation between the first-color light-emitting unit and the second-color light-emitting unit is effectively balanced by D1>D2, so that the view angle deviation phenomenon when viewing the display panel from a direction of the display panel is reduced.

It should be noted that, as shown in FIGS. 20-22, different-color light-emitting units have different luminance attenuation rates at different view angles. The first-color light-emitting unit has the greatest luminance attenuation rate at different view angles, and the second-color light-emitting unit has the smallest luminance attenuation rate at different view angles, corresponding to D1>D3>D2, so as to balance the luminance attenuation rate of the respective-color light-emitting unit at different view angles, and reduce view angle deviation phenomenon when viewing the display panel from a direction of the display panel, thereby improving the display effect. The principle is the same as the above, which is not elaborated herein.

In an embodiment of the present disclosure, in the first direction X, a thickness of the first-color color filter unit 061R is defined as n1, a thickness of the second-color color filter unit is defined as n2, and a thickness of the third-color color filter unit is defined as n3. n1, n3, n2 satisfy n1<n3<n2, and D1+n1=D3+n3=D2+n2. Compared with the related art, flatness of the color filter layer in this embodiment is improved compared to existing design. Improving luminance at a large view angle may reduce color deviation of display view angle of the display panel, while luminance attenuation rate at different view angles of each-color light-emitting unit may be balanced.

In an embodiment of the present disclosure, the touch dielectric layer corresponding to the first-color light-emitting unit includes a first surface and a second surface that are opposite to each other. The first surface is a surface of the touch dielectric layer, corresponding to the first-color light-emitting unit, at a side close to the array substrate, and the second surface is a surface of the touch dielectric layer, corresponding to the first-color light-emitting unit, at a side facing away from the array substrate. In a direction parallel to the plane of the display panel and from the first light-emitting unit towards the black matrix adjacent to the first light-emitting unit, a distance from the first surface to the second surface gradually increases.

Figure 24:
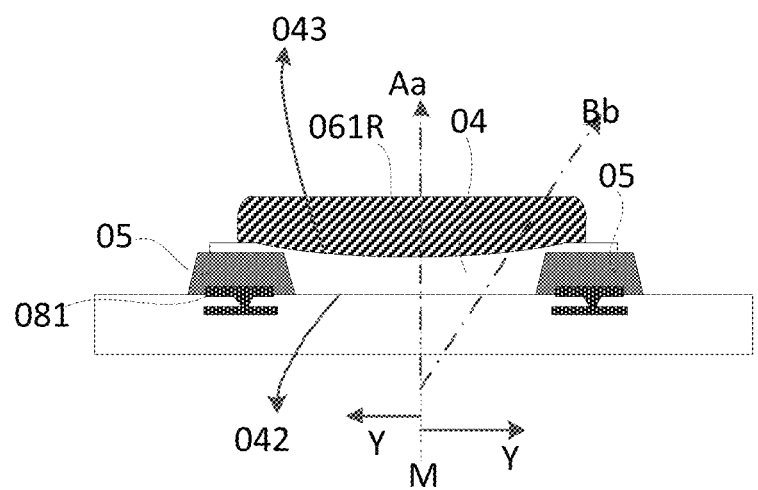
FIG. 24 is a schematic diagram showing a display panel according to yet still another embodiment of the present disclosure.

FIG. 24 is a schematic diagram showing a display panel according to yet still another embodiment of the present disclosure. As shown in FIG. 24, the touch dielectric layer 04 corresponding to the first-color light-emitting unit 031R includes a first surface and a second surface that are opposite to each other. The first surface 042 is a surface of the touch dielectric layer 04, corresponding to the first-color light-emitting unit 031R, at a side close to the array substrate, and the second surface is a surface of the touch dielectric layer 04, corresponding to the first-color light-emitting unit 031R, at a side facing away from the array substrate. In a direction (Y direction labeled in FIG. 24) parallel to the plane of the display panel and from the first light-emitting unit 031R towards the black matrix 05 adjacent to the first light-emitting unit 031R, a distance from the first surface 042 to the second surface 043 gradually increases. Compared with the related art, in this embodiment, by increasing thickness of the first-color color filter unit at a front view angle Aa, a difference between paths passed through between lights at the front view angle Aa and the large view angle Bb is reduced, so that luminance attenuation rate of the first-color light-emitting unit at different view angles is reduced. The luminance attenuation difference of the light-emitting unit increases as the large view angle increases. Furthermore, along the Y direction, a distance from the first surface 042 to the second surface 043 gradually increases, so that the luminance difference at different view angles may be gradually balanced, thereby improving the display effect.

It may be understood that along the Y direction, the distance from the first surface 042 to the second surface 043 gradually increases. That is, in a direction from the geometric center of the first-color color filter unit towards the edge of the first-color color filter unit (i.e., Y direction), the distance from the first surface 042 to the second surface 043 gradually increases. It may be also understood that the distance from the first surface 042 to the second surface 043 is the smallest at the geometric center of the first-color color filter unit.

It should be noted that the distance from the first surface 042 to the second surface 043 may be understood as the distance along the first direction X.

In an embodiment of the present disclosure, referring to FIG. 24, in a direction (Y direction) parallel to the plane of the display panel and from the first-color light-emitting unit 061R towards the black matrix 05 adjacent to the first light-emitting unit 061R, the thickness of the first-color color filter unit is gradually reduced, and the distance from the side of the first-color color filter unit 031R facing away from the array substrate 01 to the first surface is a fixed value. The first-color color filter unit complies a principle opposite to the corresponding touch dielectric layer. The distance from the side of the first-color color filter unit 031R facing away from the array substrate 01 to the first surface is a fixed value, and finally a flat surface is formed on the surface of the color filter layer facing away from the array substrate, so that a further flattening process for the color filter dielectric layer may be omitted, thereby saving costs.

Figure 25:
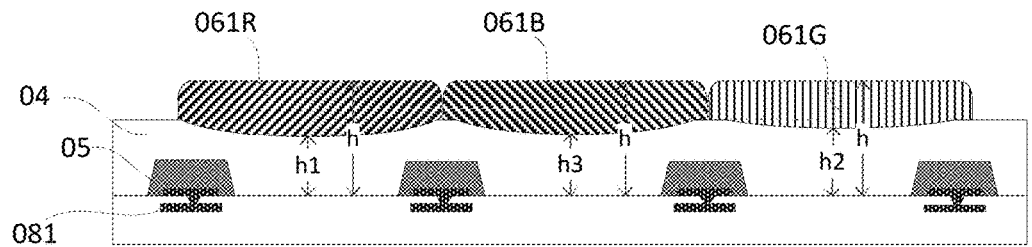
FIG. 25 is a schematic diagram showing a display panel according to yet still another embodiment of the present disclosure.

FIG. 25 is a schematic diagram showing a display panel according to yet still another embodiment of the present disclosure. As shown in FIG. 25, the color filter unit 061 includes a first-color color filter unit 061R, a second-color color filter unit 061G, and a third-color color filter unit 061B. The minimum distance between the first-color color filter unit 061R and the first surface 042 of the touch dielectric layer 04 is defined as h1. The minimum distance between the second-color color filter unit 061G and the first surface 042 of the touch dielectric layer 04 is defined as h2. The minimum distance between the third-color color filter unit 061B and the first surface 042 of the touch dielectric layer 04 is defined as h3. The minimum distances h1, h2, and h3 satisfy h1>h3>h2. Different-color light-emitting units have different luminance attenuation rates at different view angles. The first-color light-emitting unit has the greatest luminance attenuation rate at different view angles, and the second-color light-emitting unit has the smallest luminance attenuation rate at different view angles, corresponding to h1>h3>h2. The thickness difference of the color filter unit between a front angle and a large view angle of the first color unit is the smallest, and the degree of attenuation compensation is the greatest. The thickness difference of the color filter unit between a front angle and a large view angle of the second color unit is the largest, and the degree of attenuation compensation is the smallest. Therefore, the luminance attenuation rate at different view angles of the respective-color light-emitting units may be balanced, and reduce the view angle deviation phenomenon when viewing the display panel from a direction of the display panel, thereby improving display effect.

In an embodiment of the present disclosure, referring to FIG. 25, the distance from the color filter layer to the first surface of the touch dielectric layer is defined as h, and the distances from the color filter units having different colors to the first surface of the touch dielectric layer are equal to one another, and finally a flat surface is formed on the surface of the color filter layer facing away from the array substrate, so that a further flattening process for the color filter dielectric layer may be omitted, thereby saving costs.

In an embodiment of the present disclosure, referring to FIGS. 24 and 25, the second surface 043 is a curved surface, the refractive index of the touch dielectric layer 04 is less than the refractive index of the first-color color filter unit. A micro lens structure is formed by arranging a refractive index difference between the first-color color filter unit and the touch dielectric layer in order to improve light-emitting efficiency of the first-color light-emitting unit. Further, by setting the refractive index of the color filter unit to be greater than the refractive index of the touch dielectric layer below, the light-emitting efficiency of the light-emitting unit arranged corresponding to the color filter unit may be improved. In an embodiment, the curved surface includes a zigzag surface or a cambered surface.

Figure 26:
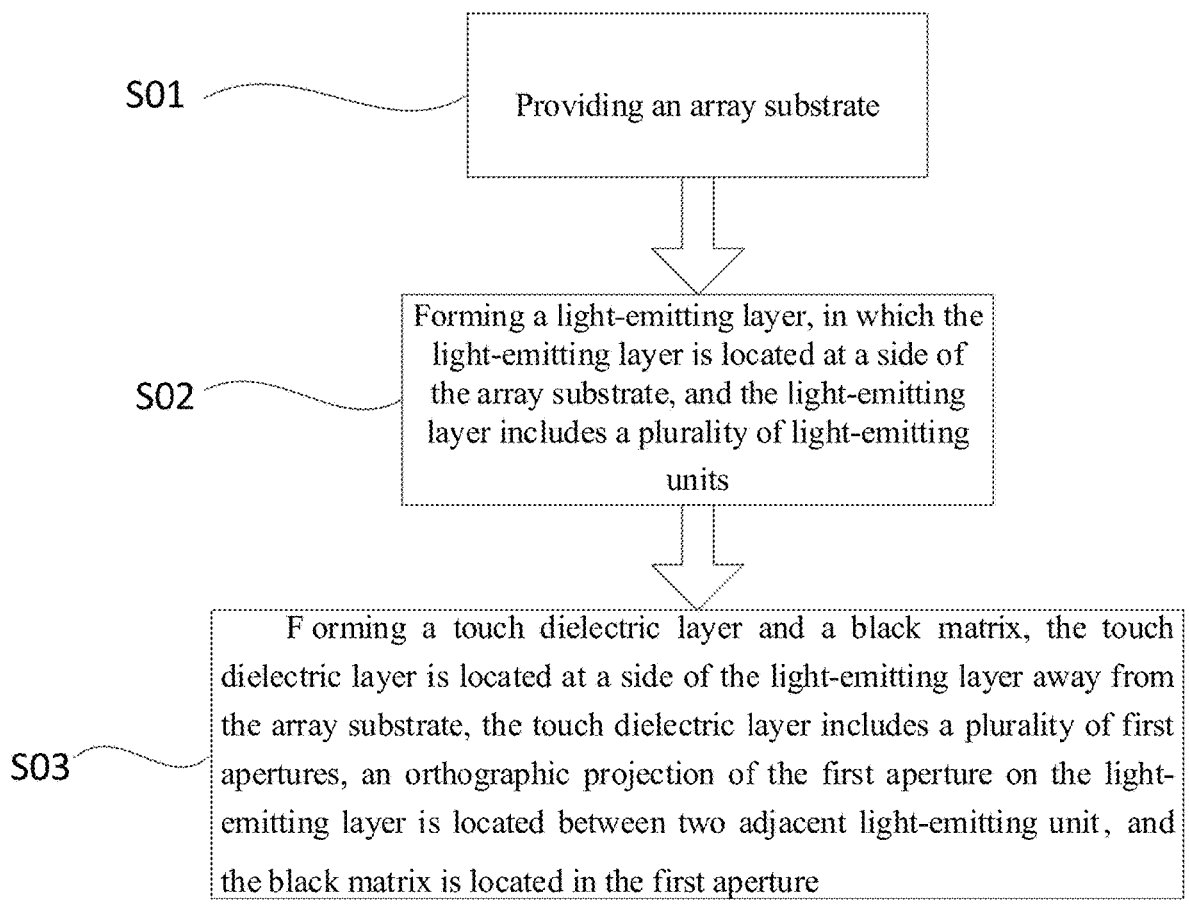
FIG. 26 is a flowchart showing a method for manufacturing a display panel according to an embodiment of the present disclosure.
Figure 27:
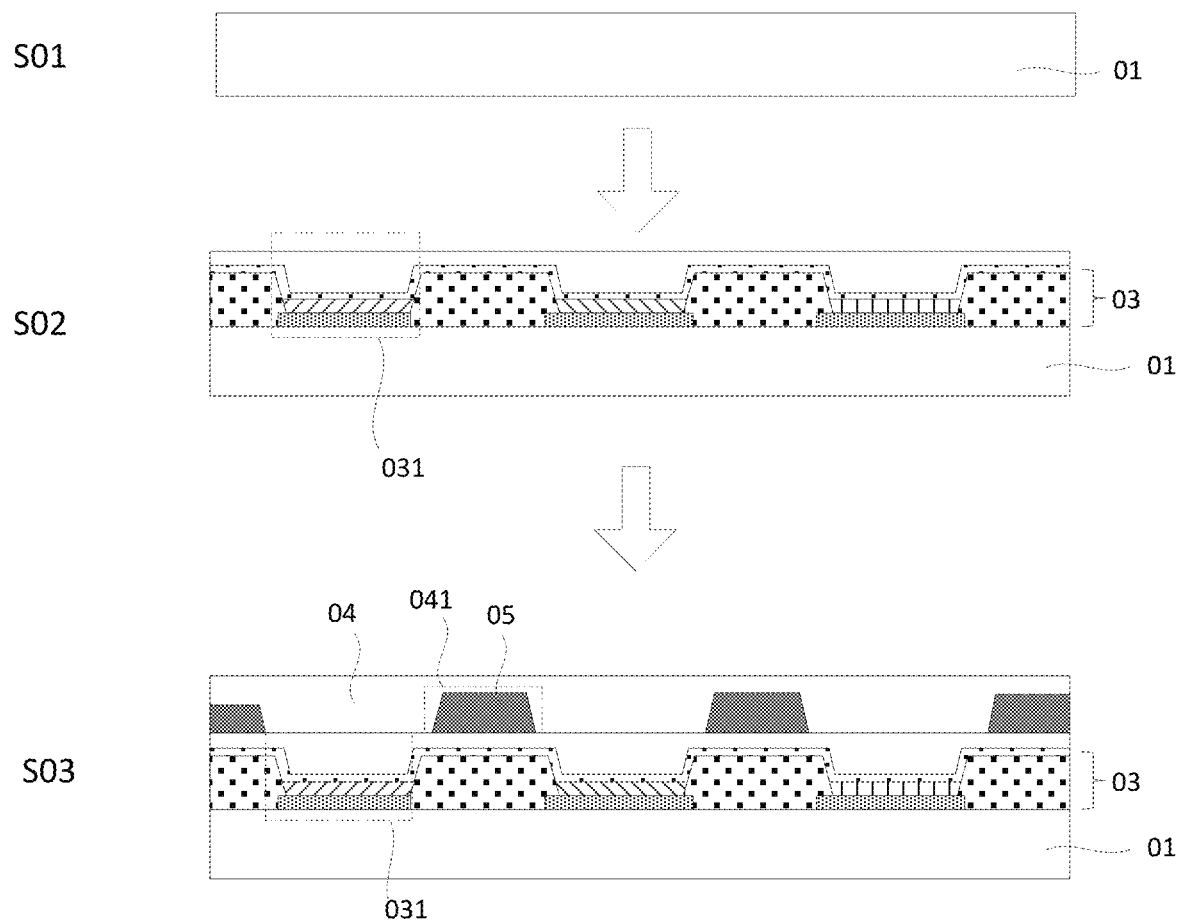
FIG. 27 is a structural schematic diagram showing a display panel corresponding to the method shown in FIG. 26.

Based on the same inventive concept, the present disclosure also provides a method for manufacturing a display panel. FIG. 26 is a flowchart showing a method for manufacturing a display panel according to an embodiment of the present disclosure. FIG. 27 is a structural schematic diagram showing a display panel corresponding to the method shown in FIG. 26. As shown in FIGS. 26 and 27, the method for manufacturing a display panel provided by the present disclosure includes: step S01, providing an array substrate 01; step S02, forming a light-emitting layer 03, in which the light-emitting layer is located at a side of the array substrate 01, and the light-emitting layer 03 includes a plurality of light-emitting units 031; step S03, forming a touch dielectric layer 04 and a black matrix 05, the touch dielectric layer 04 is located at a side of the light-emitting layer 03 away from the array substrate 01, the touch dielectric layer 04 includes a plurality of first apertures 041, an orthographic projection of the first aperture on the light-emitting layer 03 is located between two adjacent light-emitting units 031, and the black matrix 05 is located within the first aperture. Compared with the related art, in the display panel manufactured by the method of the present disclosure, on the one hand, replacing the traditional polarizer with the black matrix and color filter layer reduces the thickness of the display panel to increase flexibility of the display panel, and increases the light transmittance so as to enhance the luminance of the entire display panel. On the other hand, providing the black matrix in the first aperture of the touch dielectric layer may eliminate the horn defect of the color filter material at the edge of the color filter unit due to presence of the black matrix in a coating process. That is to say, flatness of the color filter layer in the present disclosure is improved relative to that in the related art, and improving luminance at a large view angle may reduce color deviation in display view angle of the display panel and reduce color dispersion of the ambient light reflected by the display panel. Moreover, providing the black matrix in the first aperture of the touch dielectric layer reduces a vertical distance between the light-emitting unit of the display panel and the surrounding black matrix above the light-emitting unit without affecting light emission at a large view angle.

In an embodiment of the present disclosure, forming the touch dielectric layer and the black matrix includes: first forming the touch dielectric layer, and then forming the black matrix. Before forming the black matrix, it further includes: etching the touch dielectric layer to form the first aperture, a depth of the first aperture is less than or equal to a thickness of the touch dielectric layer, and the black matrix is formed in the first aperture.

Figure 28:
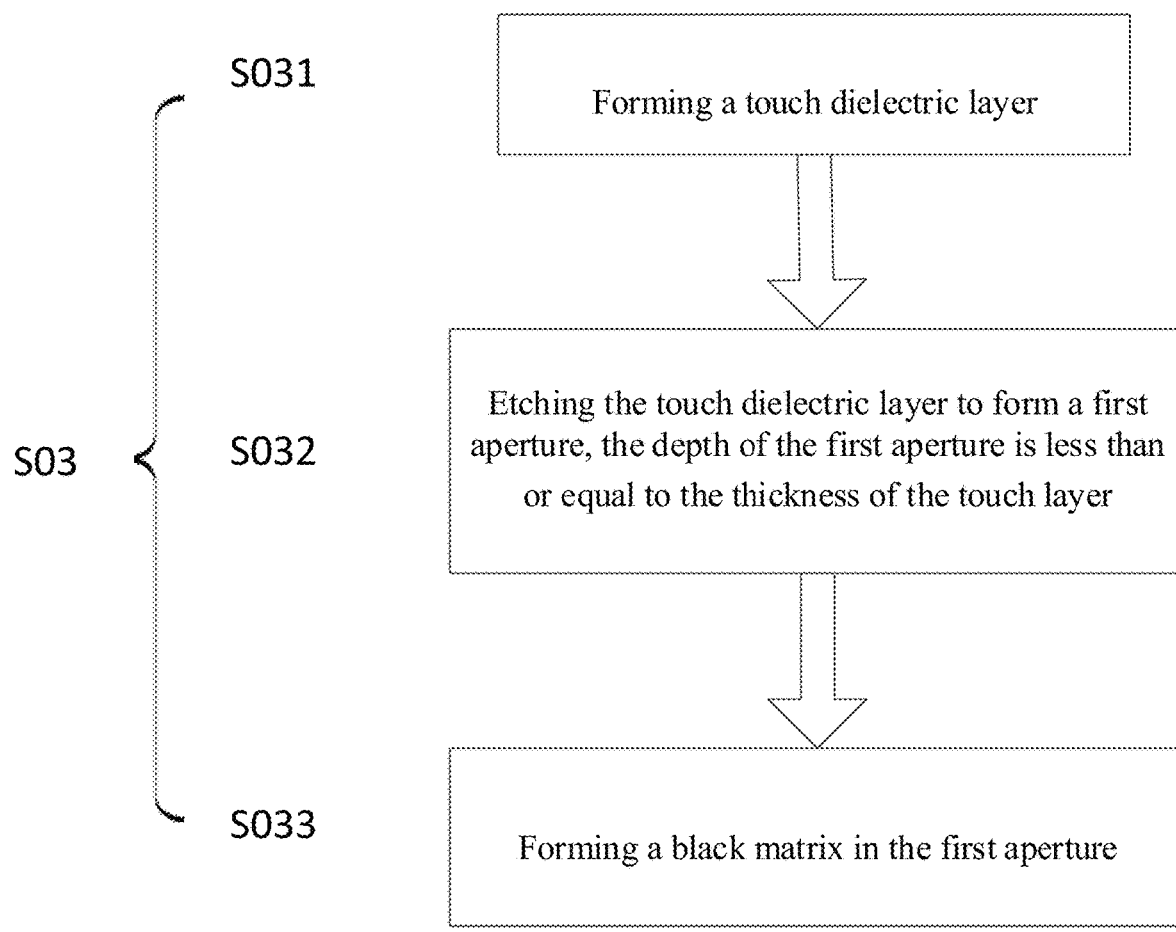
FIG. 28 is a schematic diagram showing a manufacturing method of a black matrix and a touch dielectric layer of the display panel according to an embodiment of the present disclosure.
Figure 29:
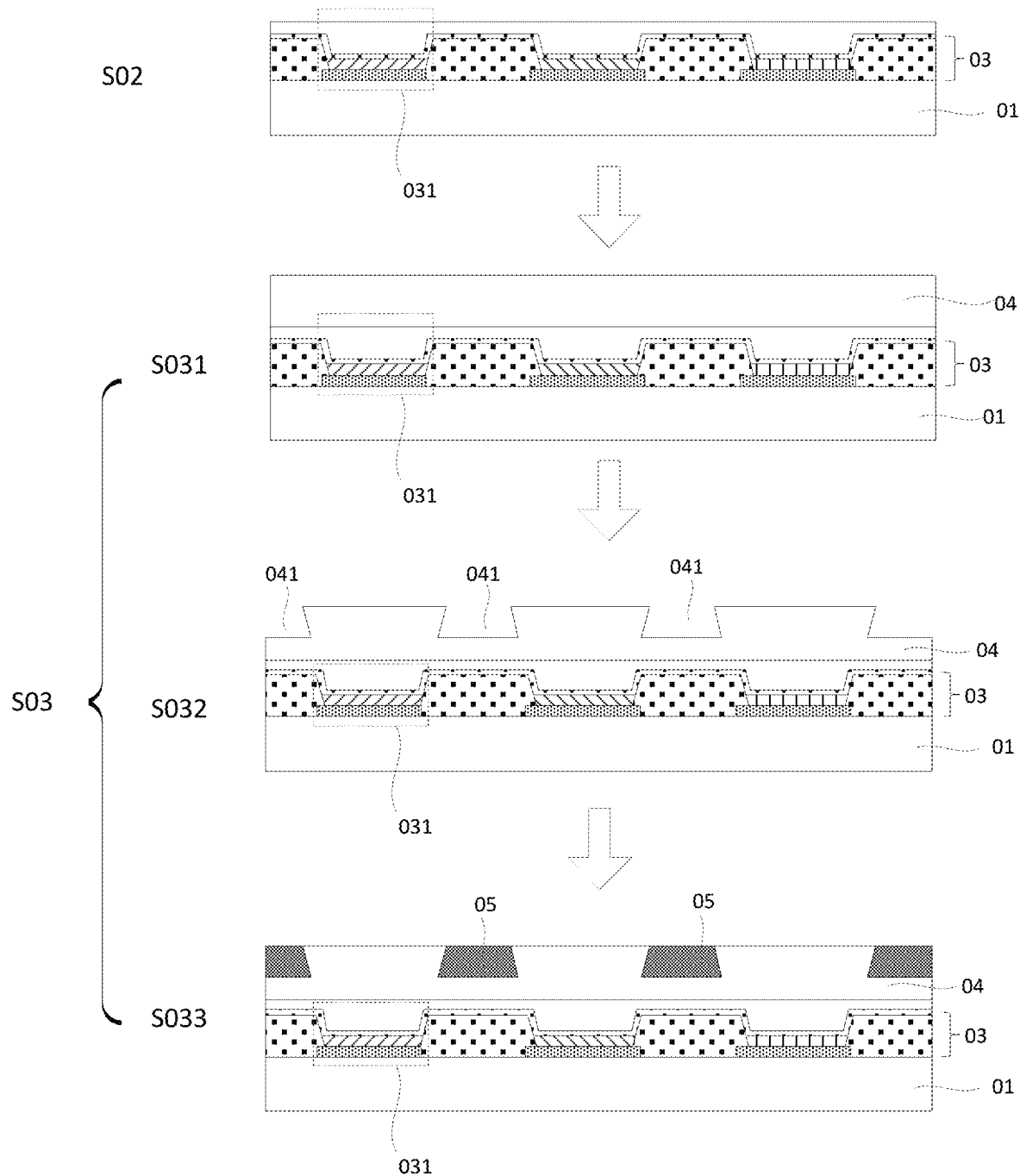
FIG. 29 is a structural schematic diagram showing a display panel corresponding to the manufacturing method shown in FIG. 28.

FIG. 28 is a schematic diagram showing a manufacturing method of a black matrix and a touch dielectric layer of a display panel according to an embodiment of the present disclosure. FIG. 29 is a structural schematic diagram showing a display panel corresponding to the manufacturing method shown in FIG. 28. Referring to FIGS. 28 and 29, step S03 includes: forming a touch dielectric layer 04 and a black matrix 05. In an embodiment of the present disclosure, step S03 includes: step S031, forming a touch dielectric layer 04; step S032, etching the touch dielectric layer 04 to form a first aperture 041; step S033, forming a black matrix 05 in the first aperture. In an embodiment, the thickness of the black matrix is less than the thickness of the touch dielectric layer. The depth of the first aperture 041 is less than or equal to the thickness of the touch dielectric layer. When the depth of the first aperture is equal to the thickness of the touch dielectric layer 04, the thickness of the filled black matrix 05 reaches the maximum, so that ambient light reflected by the anode may be effectively absorbed, thereby improving anti-reflection capacity of the display panel. When the depth of the first aperture is equal to the thickness of the touch dielectric layer 04, the black matrix does not directly contact the underlying film layer, so that risk of cracks may be reduced. For example, when a touch electrode is provided under the touch dielectric layer, direct contact between the touch electrode and the black matrix 05 may tend to cause film peeling between the black matrix 05 and the touch electrode. However, in an embodiment of the present disclosure, by providing the touch dielectric layer 04 between the touch electrode and the black matrix 05, the touch dielectric layer 04 includes an organic layer, the touch dielectric layer may effectively improve adhesion between the touch electrode and the black matrix 05, and prevent the black matrix 05 from peeling off from the underlying film layer which may result in cracks in the display panel.

In an embodiment of the present disclosure, the depth of the first aperture is greater than or equal to the thickness of the black matrix.

In an embodiment of the present disclosure, forming the touch dielectric layer and the black matrix includes: first forming the black matrix, and then forming a touch dielectric layer at a side of the black matrix facing away from the array substrate.

Figure 30:
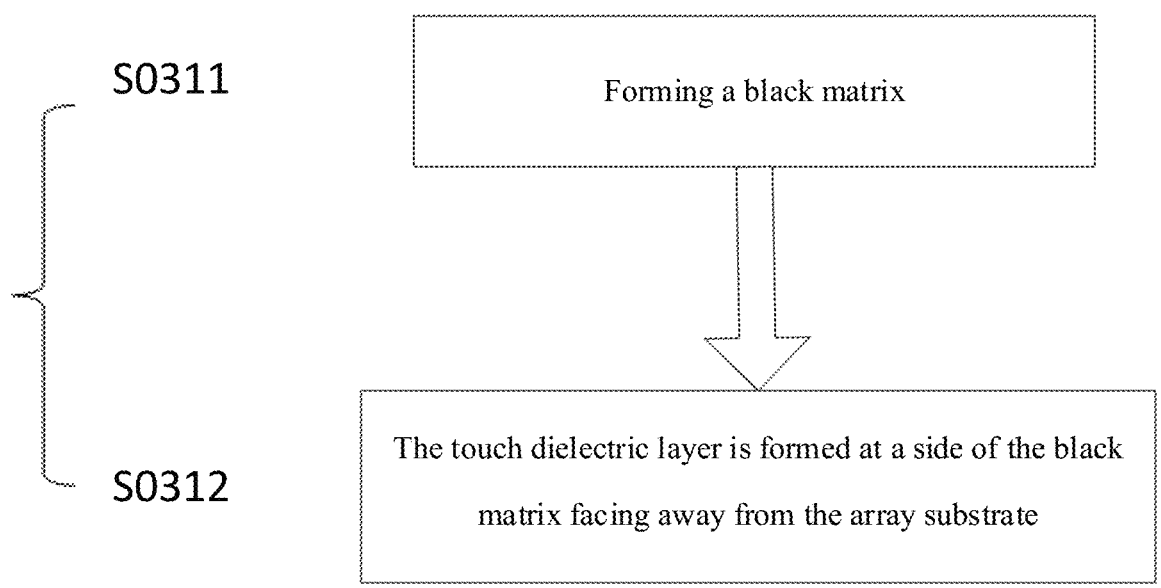
FIG. 30 is a schematic diagram showing a manufacturing method of a black matrix and a touch dielectric layer of the display panel according to another embodiment of the present disclosure.
Figure 31:
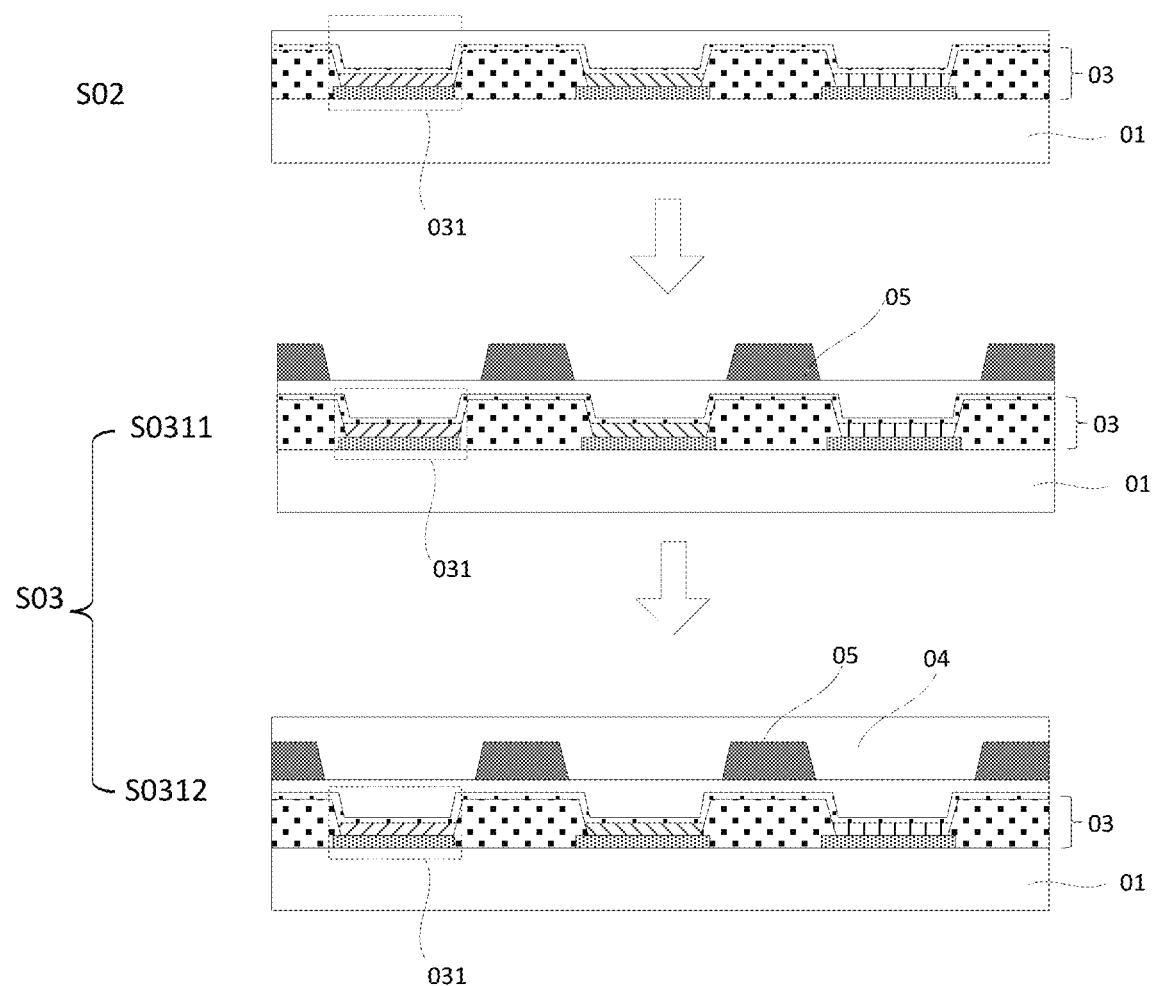
FIG. 31 is a structural schematic diagram showing a display panel corresponding to the method shown in FIG. 30.

FIG. 30 is a schematic diagram showing another alternative implementation manner of a manufacturing method of a black matrix and a touch dielectric layer of a display panel according to an embodiment of the present disclosure. FIG. 31 is a structural schematic diagram showing a display panel corresponding to the method shown in FIG. 30. Referring to FIGS. 30 and 31, step S03 includes: forming a touch dielectric layer 04 and a black matrix 05. In an embodiment, step S03 includes: step S0311, forming a black matrix 05, in which the black matrix 05 is located at a side of the light-emitting layer 03 facing away from the array substrate 01; step S0312, the touch dielectric layer 04 is formed at a side of the black matrix 05 facing away from the array substrate 01. In an embodiment of the present disclosure, the touch dielectric layer 04 covers the black matrix 05 toward a direction facing away from the light-exiting surface of the display panel. Compared with the foregoing embodiments, in this embodiment, there is no need to etch the touch dielectric layer 04 again, thereby simplifying the process and improving production yield.

Figure 32:
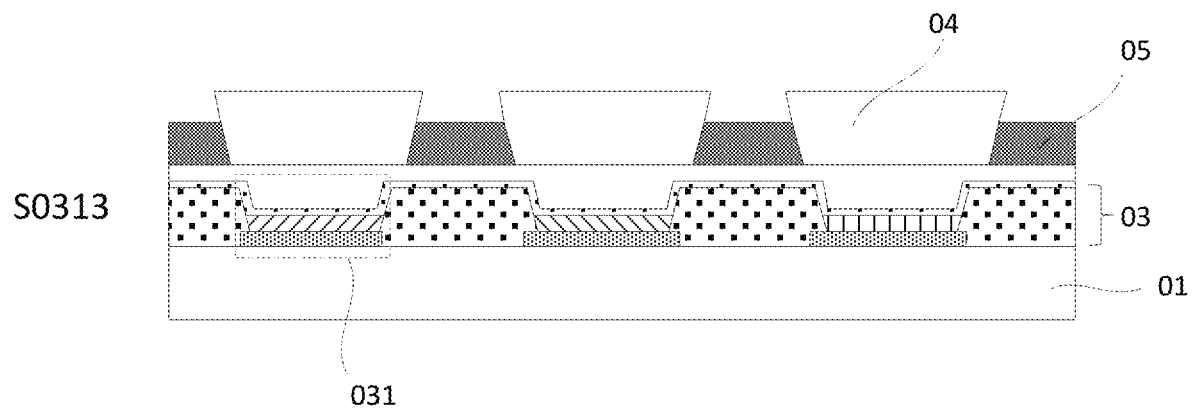
FIG. 32 is a schematic diagram showing a manufacturing method of a black matrix and a touch dielectric layer of the display panel according to still another embodiment of the present disclosure.

FIG. 32 is a schematic diagram showing a manufacturing method of a black matrix and a touch dielectric layer of a display panel according to another embodiment of the present disclosure. An overlapping portion between the black matrix 05 and the touch dielectric layer 04 is etched, and the thickness of the black matrix is less than the thickness of the touch dielectric layer 04. When the color filter material is coated to form the color filter unit, there may be protrusions in the overlapping portion. In order to avoid the color filter unit from forming new protrusions in the overlapping portion, etching the touch dielectric layer is used to reserve an accommodating space for the color filter layer overlapping region so as to avoid display non-uniformity caused by the new protrusions. Meanwhile, when the thickness of the color filter unit above the black matrix 05 is reduced, a propagation distance of light passing through the color filter unit under a large view angle may be reduced, and view angle color deviation under a large view angle and a front view angle may be further reduced.

Figure 33:
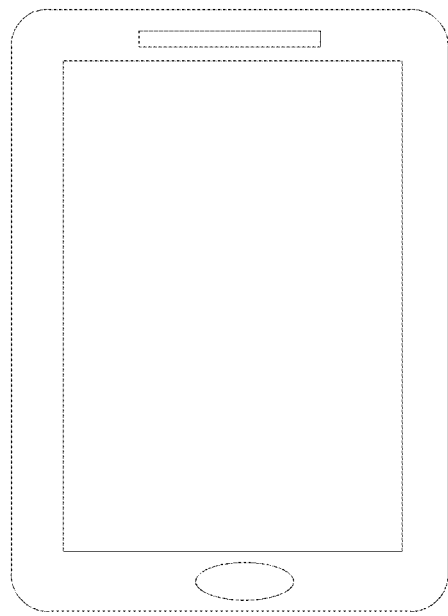
FIG. 33 is a schematic diagram showing a display device according to an embodiment of the present disclosure.

The present disclosure also provides a display device. FIG. 33 is a schematic diagram showing a display device according to an embodiment of the present disclosure. The display device includes the display panel provided by any one of the embodiments of the present disclosure. The display device provided by the present disclosure include, but are not limited to, the following: TVs, laptop computers, desktop displays, tablet computers, digital cameras, mobile phones, smart bracelets, smart glasses, on-board monitors, medical equipment, industrial control equipment, touch interaction terminals.

It may be seen from the foregoing embodiments that the display panel, the method for manufacturing the display panel, and the display device provided by the present disclosure may achieve at least following beneficial effects:

The display panel provided by the present disclosure includes an array substrate, a light-emitting layer, a touch dielectric layer, a black matrix and a color filter layer. The light-emitting layer includes a plurality of light-emitting units. The touch dielectric layer is located at a side of the light-emitting layer facing away from the array substrate. The touch dielectric layer includes a plurality of first apertures. An orthographic projection of the first aperture on the light-emitting layer is located between two adjacent light-emitting units. The black matrix is located within the first aperture of the touch dielectric layer, and the color filter layer is located at a side of the touch dielectric layer facing away from the array substrate. The color filter layer includes a plurality of color filter units. The plurality of color filter units is arranged in one-to-one correspondence to the plurality of light-emitting units. On one hand, replacing the traditional polarizer with the black matrix and color filter layer reduces the thickness of the display panel to increase flexibility of the display panel, and increases the light transmittance so as to enhance the luminance of the entire display panel. On the other hand, providing the black matrix in the first aperture of the touch dielectric layer may eliminate the horn defect of the color filter material at the edge of the color filter unit due to presence of the black matrix in a coating process. That is to say, flatness of the color filter layer in the present disclosure is improved compared to that in the related art, and improving luminance at a large view angle may reduce color deviation in display view angle of the display panel and reduce color dispersion of the ambient light reflected by the display panel. Moreover, providing the black matrix in the first aperture of the touch dielectric layer reduces a vertical distance between the light-emitting unit of the display panel and the surrounding black matrix above the light-emitting unit without affecting light emission at a large view angle.

The above contents are a further detailed description of the present disclosure in conjunction with specific preferred embodiments, which are not limited to these descriptions. For those skilled in the art, a number of simple deductions or substitutions may be made without departing from concept of the present disclosure, which shall fall into the protection scope of the present disclosure.

What is claimed is:

1. A display panel, comprising:
   an array substrate;
   a light-emitting layer located at a side of the array substrate and comprising a plurality of light-emitting units;
   a touch dielectric layer located at a side of the light-emitting layer facing away from the array substrate and comprising a plurality of first apertures, wherein an orthographic projection of each of the plurality of first apertures on the light-emitting layer is located between two adjacent light-emitting units of the plurality of light-emitting units;
   a black matrix located within each of the plurality of first apertures;
   a color filter layer located at a side of the touch dielectric layer facing away from the array substrate and comprising a plurality of color filter units, wherein the plurality of color filter units is in one-to-one correspondence to the plurality of light-emitting units,
   wherein the touch dielectric layer comprises a first surface and a second surface that are opposite to each other, and the first surface is closer to the array substrate than the second surface; and
   wherein the plurality of color filter units comprises a first-color color filter unit, a second-color color filter unit and a third-color color filter unit, wherein a minimum distance between the first surface of the touch dielectric layer and one color filter unit of at least two color filter units of the first-color color filter unit, the second-color color filter unit, and the third-color color filter unit is different from a minimum distance between the first surface of the touch dielectric layer and another color filter unit of the at least two color filter units.

2. The display panel according to claim 1, wherein
   at least one of the first surface and the second surface comprises a groove recessed toward the other one of the first surface and the second surface; and
   the groove forms the first aperture.

3. The display panel according to claim 2, wherein
   the first surface comprises the groove as a first groove, and the black matrix fills the first groove;
   a depth of the first groove in a first direction is smaller than a maximum thickness of the touch dielectric layer in the first direction; and
   the first direction is perpendicular to a plane of the display panel and towards a light-exiting surface of the display panel.

4. The display panel according to claim 2, wherein
   the second surface comprises the groove as a second groove, and the black matrix fills the second groove;
   a depth of the second groove in a first direction is less than a maximum thickness of the touch dielectric layer in the first direction; and
   the first direction is perpendicular to a plane of the display panel and towards a light-exiting surface of the display panel.

5. The display panel according to claim 2, wherein
   the first surface and the second surface each comprise a groove, the groove formed in the first surface is a first groove, and the groove formed in the second surface is a second groove;
   the first groove overlaps the second groove in a first direction, the first groove and the second groove run through the touch dielectric layer to form the first aperture; and
   the first direction is perpendicular to a plane of the display panel and towards a light-exiting surface of the display panel.

6. The display panel according to claim 5, wherein
   the first groove comprises a first sub-surface and a second sub-surface, and the first sub-surface closer to the array substrate than the second sub-surface;
   the second groove comprises a third sub-surface and a fourth sub-surface, and the third sub-surface is closer to the array substrate than the fourth sub-surface; and
   an orthographic projection of the third sub-surface on the array substrate coincides with an orthographic projection of the second sub-surface on the array substrate.

7. The display panel according to claim 6, wherein
   an area of an orthographic projection of the first sub-surface on the array substrate is defined as S1, an area of the orthographic projection of the second sub-surface on the array substrate is defined as S2, an area of the orthographic projection of the third sub-surface on the array substrate is defined as S3, and an area of an orthographic projection of the fourth sub-surface on the array substrate is defined as S4, wherein S1, S2, S3 and S4 satisfy S1>S2=S3>S4.

8. The display panel according to claim 6, wherein
   the black matrix fills both the first groove and the second groove; and
   a maximum thickness of the black matrix in the first direction is equal to a maximum thickness of the touch dielectric layer in the first direction.

9. The display panel according to claim 6, wherein
   the black matrix fills the first groove;
   a maximum thickness of the black matrix in the first direction is less than a maximum thickness of the touch dielectric layer in the first direction; and
   a part of the plurality of color filter units fills the second groove.

10. The display panel according to claim 1, further comprising a pixel definition layer located between the array substrate and the touch dielectric layer, wherein the pixel definition layer comprises a plurality of second apertures, and the plurality of light-emitting units is located within the plurality of second apertures in one-to-one correspondence;
    the plurality of first apertures does not overlap with the plurality of second apertures in a first direction; and
    the first direction is perpendicular to a plane of the display panel and towards a light-exiting surface of the display panel.

11. The display panel according to claim 1, further comprising a touch function layer located between the touch dielectric layer and the light-emitting layer, wherein the touch function layer comprises a plurality of touch electrodes, and a touch insulation layer located between the plurality of touch electrodes; and
- an orthographic projection of the black matrix on the array substrate covers an orthographic projection of the touch electrode on the array substrate.

12. The display panel according to claim 10, wherein
- a maximum width of the black matrix between two adjacent light-emitting units of the plurality of light-emitting units is defined as d1, each of the plurality of light-emitting units comprises an anode, and a shortest distance between two adjacent anodes is defined as d2, where d2≥d1.

13. The display panel according to claim 10, wherein
- the plurality of light-emitting units comprises a first-color light-emitting unit, a second-color light-emitting unit and a third-color light-emitting unit, a central wavelength of first color light is defined as λ1, a central wavelength of second color light is defined as λ2, and a central wavelength of third color light is defined as λ3, where λ1>λ2>λ3; and
- in the first direction, a thickness of the touch dielectric layer corresponding to the first-color light-emitting unit is defined as D1, a thickness of the touch dielectric layer corresponding to the second-color light-emitting unit is defined as D2, and a thickness of the touch dielectric layer corresponding to the third-color light-emitting unit is defined as D3, where D1>D3>D2.

14. The display panel according to claim 13, wherein
- the plurality of color filter units is arranged corresponding to the plurality of light-emitting units having a same color; and
- in the first direction, a thickness of the first-color color filter unit is defined as n1, a thickness of the second-color color filter unit is defined as n2, and a thickness of the third-color color filter unit is defined as n3, where n1<n3<n2, and D1+n1=D3+n3=D2+n2.

15. The display panel according to claim 10, wherein
- the plurality of light-emitting units comprises a first-color light-emitting unit, a second-color light-emitting unit, and a third-color light-emitting unit, a central wavelength of first color light is defined as λ1, a central wavelength of second color light is defined as λ2, and a central wavelength of third color light is defined as λ3, where λ1>λ2>λ3;
- the touch dielectric layer corresponding to the first-color light-emitting unit comprises a first surface and a second surface that are opposite to each other, the first surface is closer to the array substrate than the second surface; and
- in a direction parallel to the plane of the display panel and from the first light-emitting unit towards the black matrix adjacent to the first light-emitting unit, a distance from the first surface to the second surface gradually increases.

16. The display panel according to claim 15, wherein
- the first-color color filter unit is arranged corresponding to the first-color light-emitting unit;
- in a direction parallel to the plane of the display panel and from the first light-emitting unit towards the black matrix adjacent to the first light-emitting unit, a thickness of the first-color color filter unit gradually decreases; and
- a distance from a side of the first-color color filter unit facing away from the array substrate to the first surface is a fixed value.

17. The display panel according to claim 15, wherein
- the first surface is a curved surface, and a refractive index of the touch dielectric layer is less than a refractive index of the first-color color filter unit.

18. A display device comprising a display panel, wherein the display panel comprises:
- an array substrate;
- a light-emitting layer located at a side of the array substrate and comprising a plurality of light-emitting units;
- a touch dielectric layer located at a side of the light-emitting layer facing away from the array substrate and comprising a plurality of first apertures, wherein an orthographic projection of each of the plurality of first apertures on the light-emitting layer is located between two adjacent light-emitting units of the plurality of light-emitting units;
- a black matrix located within each of the plurality of first apertures;
- a color filter layer located at a side of the touch dielectric layer facing away from the array substrate and comprising a plurality of color filter units, wherein the plurality of color filter units is in one-to-one correspondence to the plurality of light-emitting units,
- wherein the touch dielectric layer comprises a first surface and a second surface that are opposite to each other, and the first surface is closer to the array substrate than the second surface; and
- wherein the plurality of color filter units comprises a first-color color filter unit, a second-color color filter unit and a third-color color filter unit, wherein a minimum distance between the first surface of the touch dielectric layer and one color filter unit of at least two color filter units of the first-color color filter unit, the second-color color filter unit, and the third-color color filter unit is different from a minimum distance between the first surface of the touch dielectric layer and another color filter unit of the at least two color filter units.

19. A method for manufacturing a display panel, comprising:
- providing an array substrate;
- forming a light-emitting layer, wherein the light-emitting layer is located at a side of the array substrate and comprises a plurality of light-emitting units; and
- forming a touch dielectric layer and a black matrix, wherein the touch dielectric layer is located at a side of the light-emitting layer facing away from the array substrate and comprises a plurality of first apertures, an orthographic projection of each of the plurality of first apertures on the light-emitting layer is located between two adjacent light-emitting units of the plurality of light-emitting units, and the black matrix is located within the first aperture,
- wherein the touch dielectric layer comprises a first surface and a second surface that are opposite to each other, and the first surface is closer to the array substrate than the second surface; and
- wherein the plurality of color filter units comprises a first-color color filter unit, a second-color color filter unit and a third-color color filter unit, wherein a minimum distance between the first surface of the touch dielectric layer and one color filter unit of at least two color filter units of the first-color color filter unit, the second-color color filter unit, and the third-color color filter unit is different from a minimum distance between the first surface of the touch dielectric layer and another color filter unit of the at least two color filter units.

20. The method according to claim 19, wherein
forming the touch dielectric layer and the black matrix
  comprises: first forming the touch dielectric layer, and
  then forming the black matrix; and
before forming the black matrix, the method further
  comprises: etching the touch dielectric layer to form the
  plurality of first apertures, wherein a depth of each of
  the plurality of first apertures is less than or equal to a
  thickness of the touch dielectric layer, and the black
  matrix is formed in the first aperture.

\* \* \* \* \*